US009293364B2

(12) United States Patent
Kanda et al.

(10) Patent No.: US 9,293,364 B2
(45) Date of Patent: Mar. 22, 2016

(54) ELECTROLESS PLATING APPARATUS AND ELECTROLESS PLATING METHOD

(71) Applicants: EBARA CORPORATION, Tokyo (JP); Dainippon Screen Mfg. Co., Ltd., Kyoto (JP)

(72) Inventors: Hiroyuki Kanda, Tokyo (JP); Junichiro Tsujino, Tokyo (JP); Junko Mine, Tokyo (JP); Makoto Kubota, Tokyo (JP); Tsutomu Nakada, Tokyo (JP); Kenichiro Arai, Kyoto (JP)

(73) Assignees: Ebara Corporation, Tokyo (JP); Screen Holdings Co., Ltd., Kyoto (JP)

( * ) Notice: Subject to any disclaimer, the term of this patent is extended or adjusted under 35 U.S.C. 154(b) by 414 days.

(21) Appl. No.: 13/677,388

(22) Filed: Nov. 15, 2012

(65) Prior Publication Data

US 2013/0122704 A1    May 16, 2013

(30) Foreign Application Priority Data

Nov. 16, 2011  (JP) ................................. 2011-250433
Nov. 16, 2011  (JP) ................................. 2011-250434
Nov. 16, 2011  (JP) ................................. 2011-250435

(51) Int. Cl.
  *H01L 21/768*   (2006.01)
  *C23C 18/16*   (2006.01)
  (Continued)

(52) U.S. Cl.
  CPC ........ *H01L 21/76838* (2013.01); *C23C 18/163* (2013.01); *C23C 18/168* (2013.01); *C23C 18/1628* (2013.01); *C23C 18/1632* (2013.01); *C23C 18/1669* (2013.01); *C23C 18/1675* (2013.01); *C23C 18/1682* (2013.01); *C23C 18/1683* (2013.01); *H01L 24/11* (2013.01); *H01L 24/742* (2013.01); *C23C 18/1651* (2013.01); *C23C 18/32* (2013.01); *C23C 18/54* (2013.01); *H01L 24/13* (2013.01); *H01L 2224/0401* (2013.01); *H01L 2224/05567* (2013.01); *H01L 2224/05624* (2013.01);
  (Continued)

(58) Field of Classification Search
  None
  See application file for complete search history.

(56) References Cited

U.S. PATENT DOCUMENTS 6,524,463 B2 *  2/2003  Gramarossa et al. ......... 205/137
7,141,274 B2 * 11/2006  Wang et al. ................ 427/430.1
(Continued)

FOREIGN PATENT DOCUMENTS

JP       5-311450 A    11/1993
JP       07-308642     11/1995
(Continued)

*Primary Examiner* — Alexander Ghyka
(74) *Attorney, Agent, or Firm* — Baker & Hostetler LLP

(57) ABSTRACT

There is provided an electroless plating apparatus which, despite using a high-productivity batch processing method, can reduce the amount of a liquid chemical brought out of a processing tank, thereby reducing the cleaning time in a cleaning step, and can perform flushing easily and quickly. The electroless plating apparatus includes a pre-plating treatment module including a pre-plating treatment tank, a plating module, and an inter-module substrate transport device. The pre-plating treatment tank is provided with a pre-plating treatment solution circulation line having a temperature control function for a pre-plating treatment solution. The plating tank is provided with a plating solution circulation line having a filter and a temperature control function for a plating solution. The plating solution circulation line is connected to a flushing line for flushing the interior of the plating solution circulation line and the interior of the plating tank.

20 Claims, 37 Drawing Sheets

(51) Int. Cl.
*H01L 23/00* (2006.01)
*C23C 18/32* (2006.01)
*C23C 18/54* (2006.01)

(52) U.S. Cl.
CPC . *H01L2224/11464* (2013.01); *H01L 2224/742* (2013.01); *H01L 2924/00014* (2013.01)

(56) References Cited

U.S. PATENT DOCUMENTS

| | | | |
|---|---|---|---|
| 8,257,761 B2 * | 9/2012 | Jacob | 426/51 |
| 2003/0056391 A1 * | 3/2003 | Shikami | 34/92 |
| 2004/0062861 A1 | 4/2004 | Sato | |
| 2004/0140199 A1 | 7/2004 | Mizohata et al. | |
| 2004/0231997 A1 | 11/2004 | Wang et al. | |
| 2007/0264436 A1 | 11/2007 | Dordi et al. | |

FOREIGN PATENT DOCUMENTS

| | | |
|---|---|---|
| JP | 07-316827 | 12/1995 |
| JP | 10-229066 | 8/1998 |
| JP | 2003-092281 | 3/2003 |
| JP | 2004-131774 | 4/2004 |
| JP | 2005-101185 | 4/2005 |
| JP | 3974985 B2 | 6/2007 |
| JP | 2009-57593 A | 3/2009 |
| KR | 10-0564779 B1 | 3/2006 |
| TW | 200831702 A | 8/2008 |

* cited by examiner

ELECTROLESS PLATING APPARATUS AND ELECTROLESS PLATING METHOD

CROSS REFERENCE TO RELATED APPLICATIONS

This document claims priorities to Japanese Application No. 2011-250433 filed Nov. 16, 2011, Japanese Application No. 2011-250434 filed Nov. 16, 2011 and Japanese Application No. 2011-250435 filed Nov. 16, 2011, the entire contents of which are hereby incorporated by reference.

BACKGROUND OF THE INVENTION

1. Field of the Invention

The present invention relates to an electroless plating method and an electroless plating apparatus, and more particularly to an electroless plating method and an electroless plating apparatus which, despite using a high-productivity batch processing method, make it possible to stably perform uniform processing of a surface of a substrate, such as a semiconductor wafer.

2. Description of the Related Art

As a three-dimensional packaging technique for electrical connection between semiconductor chips, a method has been proposed in which, as shown in FIG. 1, a microbump 12, provided at a predetermined position on a CPU 10, and a microbump 16, provided at a predetermined position on a memory 14, are used as electrodes, and the microbumps (electrodes) 12, 16 are bonded together.

The microbump 16 provided on the memory 14 is made of, for example, a Cu—Sn alloy. The microbump 12 on the CPU 10 can be formed by forming, e.g., an Ni plated film 20 having a thickness of 2 to 10 µm on a surface of a bump pad 18, e.g., made of Al or Cu, and forming, e.g., an Au plated film 22 having a thickness of 50 to 200 nm on a surface of the Ni plated film 20. Upon the bonding of the microbumps 12 and 16, the Au plated film 22 diffuses into the microbump 16, e.g., made of a Cu—Sn alloy. The Au plated film 22 thus does not contribute to the bonding, but serves to prevent oxidation of the surface of the Ni plated film 20, thereby ensuring the bonding strength.

The microbump 16 provided on the memory 14 is not directly connected to the bump pad 18, e.g., made of Cu, because of damage to, e.g., a low-k material underlying the bump pad 18. Thus, the Ni plated film 20 and the Au plated film 22 are employed as a buffer.

In TSV (through silicon via) interconnection bonding, a method has been proposed which involves bonding a front-surface bump 36, consisting of an Ni plated film 32 formed on the front side of a TSV 30 and an Au plated film 34 formed on the Ni plated film 32, and a back-surface bump 38 formed on the back side of a TSV 30 of another substrate each other, as shown in FIG. 2.

The use of electroless plating, in place of electroplating, is being studied for the formation of the above-described Ni plated films 20, 32 and Au plated films 22, 34. The use of electroless plating, in place of electroplating, is being studied also for the formation of plated films of materials other than Ni and Au, such as Co, Pd, Pt, Cu, Sn, Ag, Rh, Ru etc., or a composite material thereof.

Al and Cu are commonly used as the metal (bump pad 18) underlying the microbump 12, shown in FIG. 1. Al and Cu are not catalytic metals such as Fe, Co, Ni, Pd, Pt, etc. Therefore, when the underlying metal is Al or Cu, a zincate treatment for the Al surface or a Pd catalyst application treatment (or initial application of electric current) for the Cu surface is generally carried out as a pre-plating treatment. In the zincate treatment of the Al surface, zinc is generally applied to the Al surface by displacement plating. Zinc itself acts as a catalyst poison and inhibits a catalytic action. It is therefore necessary to control the amount of zinc plated (displaced) at an appropriate level in the zincate treatment. In the subsequent electroless plating, the zinc is replaced with a catalytic metal with which electroless plating is possible.

As described above, a pre-plating treatment (activation treatment) of an Al surface or a Cu surface is effected by displacement plating with, e.g., a catalytic metal or zinc. For example, a Pd catalyst application treatment can be carried out, e.g., by immersing a substrate in a sulfuric acid-based solution containing palladium sulfate. A zincate treatment can be carried out by immersing a substrate in a sodium hydroxide-based solution containing zinc oxide. Prior to a pre-plating (activation) treatment of a substrate surface, the substrate surface is generally cleaned, e.g., with nitric acid or citric acid to remove an oxide film or contaminants from the substrate surface, and then cleaned with water. The pre-plating treatment is carried out subsequent to the water cleaning and without predrying of the substrate surface. Electroless plating of the substrate surface is carried out subsequent to the cleaning with water of the substrate surface after the pre-plating treatment and without predrying of the substrate surface. Thus, the sequence of electroless plating processing steps is carried out successively without drying of the substrate surface. This is because if the substrate surface is dried after the pre-cleaning or the pre-plating treatment, then an oxide film will be formed on the substrate surface, leading to poor plating.

Pre-plating treatments can cause various problems such as: damage to an underlying material, poor adhesion between a displacement plated film and an underlying metal, roughening of a plated film, etc. in the case of a patterned wafer; and poor uniformity of the surface morphology, leading to poor appearance, etc. in the case of an unpatterned wafer.

In a pre-plating treatment (activation treatment) for electroless plating, it is important to perform displacement plating with Zn or Pd densely and uniformly. The amount of displacement plating and the amount of surface etching are greatly influenced by the concentration of an etching agent contained in a treatment solution, for example, the concentration of NaOH in a pre-plating treatment (zincate treatment) of an Al surface with a sodium hydroxide-based solution containing zinc oxide, or the concentration of sulfuric acid in a pre-plating treatment (Pd catalyst application treatment) of a Cu surface with a sulfuric acid-based solution containing palladium sulfate. In some cases, the amount of displacement plating and the amount of surface etching are determined in a few seconds.

Electroless plating apparatuses can be classified roughly into electroless processing apparatuses using a single-substrate processing method in which substrates are processed in a one-by-one manner, and electroless plating apparatuses using a batch processing method in which a plurality of substrates are simultaneously held and processed. The plating rate in electroless plating is generally 1 to 20 µm/s, which is significantly lower than that of electroplating. Therefore, when employing electroless plating for processing that requires a lot of time, such as the formation of bumps, the use of a batch processing method rather than a single-substrate processing method is generally preferred.

Electroless plating apparatuses of the batch processing type have the advantage that with the same footprint, the throughput is much higher as compared to the single-substrate processing type. On the other hand, in an electroless plating apparatuses of the batch processing type, a plurality of substrates, arranged parallel to each other and each held in a vertical position, are simultaneously immersed and processed in a processing liquid, such as a pre-plating treatment solution or a plating solution. Therefore, a metal in a plating solution, for example, is consumed generally in a large amount during one batch processing. Further, a large amount of a processing liquid, such as a liquid chemical or pure water, will adhere to substrates and will be brought out of the processing tank. In addition, it is necessary to frequently perform flushing of, e.g., a plating solution circulation line to remove extraneous matter from the interior of the line, e.g., with an etching liquid. Furthermore, compared to the single-substrate processing type, an electroless plating apparatuses of the batch processing type is generally inferior in the processing performance (the uniformity of the thickness and the quality of a plated film) that is dependent on the time it takes to fully immerse a substrate, from the upper end to the lower end, in a processing liquid, the direction of the flow of a processing liquid, the uniformity of the temperature distribution in a processing liquid, etc.

In electroless plating using a batch processing method, it is common practice to replenish a plating solution with a metal by the following replenishing methods: estimated metal replenishment based on the consumption of the metal, calculated from the plating area and the plating time; and metal replenishment based on the results of periodic analysis of the plating solution. For example, estimated replenishment of metal ions may be performed per batch and, in addition, replenishment of metal ions based on an analysis of the plating solution may be performed every few days. The full replacement of the plating solution may be made when the amount of the metal deposited reaches a certain value.

The applicant has proposed a substrate processing apparatus of the batch processing type, including a substrate holder for holding a plurality of substrates and immersing the substrates in a processing liquid in a processing tank. The substrate holder, holding the substrates, is rotated in the processing liquid in the processing tank (see patent document 1). A substrate processing apparatus of the batch processing type has also been proposed which includes a carrier stage, a horizontal transfer robot, a posture conversion mechanism, a pusher, a transport mechanism and a substrate processing section, and which is configured to transport and process a plurality of substrates in parallel (see patent document 2). Further, an electroless plating tank has been proposed which is capable of creating a uniform flow of a plating solution over a surface of a flat plate-like plating object. The plating tank is provided with a pair of impellers disposed on both sides of the plating object and which rotate in the same direction to create a flow of the plating solution between the plating object and a guide plate. The direction of rotation of the impellers is periodically reversed (see patent document 3).

PRIOR ART DOCUMENTS

Patent document 1: Japanese Patent Laid-Open Publication No. 2009-57593
Patent document 2: Japanese Patent No. 3974985
Patent document 3: Japanese Patent Laid-Open Publication No. H5-311450

SUMMARY OF THE INVENTION

A well-known electroless plating apparatus using a batch processing method includes a transport robot which holds a plurality of substrates in a vertical position and travels in a horizontal direction, and a plurality of processing tanks disposed along the traveling direction of the transport robot. Substrates are held and transported by the transport robot, and the substrates held by the transport robot are immersed in a processing liquid in a processing tank to process the substrates. The substrates are processed sequentially in the processing tanks. It is also a common practice to use a substrate carrier which holds a plurality of substrates each in a vertical position, and to transport the substrate carrier by a transport robot.

However, when a plurality of substrates are transported and immersed in a processing liquid in a processing tank by using one transport robot or one substrate carrier, a large amount of a liquid chemical will be brought out of a chemical tank. A long cleaning time and the use of a large amount of pure water will therefore be needed for the next-step cleaning with water, resulting in a lowered throughput and an increased cost.

Further, in the case of an electroless plating apparatus using a batch processing method, it is necessary to frequently perform flushing of, e.g., a plating solution circulation line to remove extraneous matter from the interior of the line, e.g., with an etching liquid. A strong demand therefore exists for the development of an electroless plating apparatus which enables the flushing to be performed easily and quickly.

When a plating solution is replenished with a metal based on the above-described calculation or on periodic analysis of the plating solution, it is difficult to precisely determine the state of the plating solution immediately before plating. Further, the state of the plating apparatus is not taken into consideration when replenishing the plating solution with the metal. Therefore, despite the correction of the metal concentration of the plating solution by the replenishment of the metal, there can be a significant change, e.g., a larger-than-expected decrease, in the thickness of a plated film, e.g., due to unexpected deposition of the metal during plating.

Generally in an electroless plating apparatus using a batch processing method, a substrate holder, holding a plurality of substrates such as semiconductor wafers in a vertical position, is moved and, before or after the movement, the substrates are simultaneously immersed in a processing liquid in a processing tank to carry out processing of the substrates. When, for example, moving the substrates held by the substrate holder from a water-cleaning tank to a zincate treatment tank, water is likely to accumulate on the lowest portions of the substrates because the substrates are each held in a vertical position by the substrate holder. Further, water that has adhered to the substrate holder during processing of substrates of the preceding lot is likely to remain in the substrate holder.

When a zincate treatment is carried out on a substrate surface with water non-uniformly remaining on the substrate surface, variation in the concentration of a zincate solution will be produced upon mixing of the zincate solution with the remaining water. The concentration variation of the zincate solution may lead to poor appearance in the case of an unpatterned wafer and increased in-plane variation in the thickness of a plated film in the case of a patterned wafer.

FIG. 3 shows the relationship between the amount of zinc displaced (plated) and the processing time (sec) in a zincate treatment of an Al surface in the case where some water remains on the surface ($A_1$) and in the case where no water remains on the surface ($B_1$). FIG. 4 shows the relationship between the amount of aluminum etched and the processing time (sec) in a zincate treatment of an Al surface in the case where some water remains on the surface ($A_2$) and in the case where no water remains on the surface ($B_2$).

As shown in FIGS. 3 and 4, in a zincate treatment of an Al surface, which is generally performed at a high Al etching rate and a high displacement plating rate, the amount of aluminum etched and the amount of zinc displaced (plated) are determined within the initial several seconds (2 to 5 seconds). The data also indicates that the amount of aluminum etched and the amount of zinc displaced (plated) are larger in a surface portion where residual water is present. As will be appreciated from the data shown in FIGS. 3 and 4, when a zincate treatment is carried out on an Al surface with water non-uniformly remaining on the surface, the surface aluminum will be non-uniformly displaced by zinc, resulting in the formation of a rough zinc plated film. Further, damage is likely to be caused to the underlying metal.

A large amount of zinc dissolves in an electroless plating solution at a place where a large amount of zinc has deposited. Thus, when a non-uniform rough zinc plated film has been formed on a substrate surface, the zinc concentration in an electroless plating solution becomes non-uniform. Because dissolved zinc acts as a catalyst poison, the variation in the zinc concentration will result in the formation of a plated film having a non-uniform thickness. Further, when a plurality of substrates, held in a vertical position and parallel to each other, are immersed in a processing liquid, there is a difference in the processing time between an upper portion and a lower portion of each substrate. This may result in a difference in the thickness of a plated film between the upper and lower portions of the substrate. The difference will be market especially in a processing step whose processing time is short, such as a zincate treatment step.

If a substrate is allowed to stand in the air for a long time in order to remove water from the substrate, the substrate surface will become dry and an oxide film will be produced on a metal surface, causing poor displacement plating. If a considerable amount of a processing liquid remains on a substrate or on a substrate holder after withdrawing the substrate from the processing liquid, the residual liquid will affect the amount of etching and the degree of water cleaning.

A zincate treatment solution generally has a high viscosity. When withdrawing a substrate from such a treatment solution, a large amount of the solution is likely to adhere to the substrate or a substrate holder and to be brought out of a treatment tank. An Au plating solution is generally expensive, and therefore it is desirable to minimize the amount of the processing liquid brought out of a plating tank.

As is known, in electroless plating the flow state of a plating solution, flowing along a surface of a substrate as a plating object, greatly affects the thickness and the shape of a plated film formed on the surface of the substrate.

FIG. 5 shows a substrate holder 44 provided in a well-known conventional electroless plating apparatus using a batch processing method. As shown in FIG. 5, the substrate holder 44 holds a plurality of substrates W in a vertical position and parallel to each other. The substrates W are supported on horizontally-extending support rods 42 secured to a side plate 40. The substrates W held by the substrate holder 44 are simultaneously immersed in a plating solution flowing upward in a not-shown plating tank.

As shown in FIG. 6, when the substrates W, held in a vertical position and parallel to each other by the substrate holder 44, are simultaneously immersed in the upward-flowing plating solution, a flow of the plating solution, flowing in a direction away from a substrate W, is created in the vicinity of the lowest portion of the substrate W by collision of the plating solution with the substrate W, whereas a flow of the plating solution, flowing in a direction closer to a substrate W, is created in the vicinity of the highest portion of the substrate W. The occurrence of such flow turbulence in the plating solution around the peripheral portions of a substrate W will produce a difference in the thickness and the shape of a plated film, formed on the surface of the substrate W, between the central portion and the peripheral portions of the substrate W.

The present invention has been made in view of the above situation. It is therefore a first object of the present invention to provide an electroless plating apparatus which, despite using a high-productivity batch processing method, can reduce the amount of a liquid chemical, including a plating solution, brought out of a processing tank, thereby reducing the cleaning time in a cleaning step, can perform flushing of, e.g., the interior of a plating solution circulation line easily and quickly, and can determine the state of a plating solution and the state of a plating apparatus, making it possible to manage the plating solution stably and extend the lifetime of the plating solution.

It is a second object of the present invention to provide an electroless plating apparatus and an electroless plating method which, despite using a high-productivity batch processing method, can minimize the amount of water brought from the preceding processing step, thereby making it possible to perform a sequence of successive processing steps in a stable and uniform manner.

It is a third object of the present invention to provide an electroless plating apparatus which, despite using a high-productivity batch processing method and employing a relatively simple construction, allows a plating solution to flow more uniformly over an entire area of a substrate surface, making it possible to form a plated film with enhanced in-plane uniformity of the thickness and the shape.

In order to achieve the first object, the present invention provides an electroless plating apparatus comprising a pre-plating treatment module including a pre-plating treatment tank for carrying out a pre-plating treatment of a plurality of substrates, a water-cleaning tank for cleaning with water the substrates after the pre-plating treatment, and a substrate holder for supporting the lower sides of the substrates and transporting the substrates between the tanks; a plating module including a plating tank for carrying out electroless plating of the substrates after the pre-plating treatment, a water-cleaning tank for cleaning with water the substrates after the electroless plating, and a substrate holder for supporting the lower sides of the substrates and transporting the substrates between the tanks; and an inter-module substrate transport device for gripping the substrates from above and transporting the substrates between the pre-plating treatment module and the plating module. The pre-plating treatment tank is provided with a pre-plating treatment solution circulation line having a temperature control function for a pre-plating treatment solution, and the plating tank is provided with a plating solution circulation line having a filter and a temperature control function for a plating solution. The plating solution circulation line is connected to a flushing line for flushing the interior of the plating solution circulation line and the interior of the plating tank.

By thus providing a substrate holder for each processing module, the construction of the substrate holder can be simplified. This can reduce the amount of a liquid chemical, including a plating solution, brought out of a processing tank, and can reduce the cleaning time in a cleaning step, thereby increasing the throughput. Further, flushing of the interior of the plating solution circulation line and the interior of the plating tank, e.g., with an etching liquid can be performed easily and quickly via the flushing line connected to the plating solution circulation line.

In a preferred aspect of the present invention, the pre-plating treatment is a zincate treatment of an Al surface, and the pre-plating treatment tank is a zincate treatment tank.

In the case where electroless plating is carried out on a cupper surface, a Pd catalyst application treatment may be carried out as a pre-plating treatment.

In a preferred aspect of the present invention, the water-cleaning tank of the plating module is provided with a liquid chemical supply line for supplying a liquid chemical for removing an oxide film from a surface of a plated film.

In a preferred aspect of the present invention, at least one of the pre-plating treatment tank and the water-cleaning tank both of the pre-plating treatment module and the water-cleaning tank of the plating module has a QDR (quick dump rinse) function.

The provision of a QDR function makes it possible to rinse (clean) a substrate surface with water sufficiently in a short time, enabling downsizing of the apparatus.

In a preferred aspect of the present invention, the pre-plating treatment module and the plating module are housed in a housing having an air conditioning function for creating a downward air flow.

In a preferred aspect of the present invention, the electroless plating apparatus further comprises a drying unit for drying the substrates after post-plating cleaning with water.

In a preferred aspect of the present invention, the electroless plating apparatus further comprises a substrate station for temporarily placing thereon the substrates before processing.

In a preferred aspect of the present invention, the plating tank is provided with a plating solution replenishing device for measuring the metal concentration of the plating solution immediately before plating and the metal concentration of the plating solution immediately after plating, calculating the amount of metal deposited from the difference in the metal concentration between the plating solutions, comparing the amount of metal deposited with a target value and, according to the amount of metal deposited, supplying a replenisher solution having a predetermined metal concentration to the plating solution.

The use of the plating solution replenishing device makes it possible to manage a plating solution based on accurate determination of the state of the plating solution and the state of the plating apparatus. It therefore becomes possible to reduce variation in the thickness of a plated film and to respond to an unexpected decrease in the plating rate while preventing damage to a product due to a failure in the plating apparatus.

In a preferred aspect of the present invention, the metal concentration of the replenisher solution is corrected and, when the number of corrections exceeds a preset number of corrections, a plating solution is re-prepared.

In a preferred aspect of the present invention, the metal concentration of the plating solution after replenishing the plating solution with an amount of metal, corresponding to the amount of metal deposited during plating, and the metal concentration of the plating solution immediately before the next plating are measured and, when the latter metal concentration is lower than the former metal concentration, the filter is cleaned.

According to the electroless plating apparatus of the present invention having the above construction, it becomes possible to reduce the amount of a liquid chemical, including a plating solution, brought out of a processing tank. This can reduce the cost of the liquid chemical per substrate and, in addition, can reduce the cleaning time in a cleaning step, thereby increasing the throughput. Furthermore, flushing of, e.g., the interior of the plating solution circulation line, e.g., with an etching liquid can be performed easily and quickly.

The state of a plating solution and the state of the plating apparatus may be continually monitored via the metal concentration of the plating solution. This can avoid the occurrence of a failure in the plating apparatus, thereby preventing damage to the product.

In order to achieve the second object, the present invention provides another electroless plating apparatus having a substrate holder for holding a plurality of substrates in a vertical position and parallel to each other, transporting the substrates and, before and after the transportation, simultaneously immersing the substrates in different processing liquids in different processing tanks. The substrate holder comprises support rods each having a plurality of support grooves for placing therein peripheral portions of the substrates to support the substrates; and a water removal mechanism for removing water that has collected in the support grooves and their vicinities.

For example, after withdrawing the substrates, held by the substrate holder, from a processing liquid, water (processing liquid) that has collected in the support grooves, for placing therein peripheral portions of the substrates to support the substrates, and their vicinities can be removed by the water removal mechanism. This can minimize the amount of water brought to the subsequent processing, making it possible to carry out the subsequent processing more stably.

In a preferred aspect of the present invention, the water removal mechanism includes a pressurized gas supply line and a liquid intrusion prevention line which are to be selectively connected to an open end of a central hole which is closed at one end and provided in an interior of each support rod, and which communicates with the support grooves via communicating holes.

By supplying a pressurized gas, such as pressurized air, through the pressurized gas supply line into the central hole and the communicating holes of each support rod, and jetting the pressurized gas in the support grooves, water (processing liquid) that has collected in the support grooves and their vicinities can be blown off by the pressurized gas. The liquid intrusion prevention line can prevent a processing liquid from intruding into the central hole and the communicating holes of each support rod during processing.

In a preferred aspect of the present invention, the water removal mechanism includes a water suction line and a liquid intrusion prevention line which are to be selectively connected to an open end of a central hole which is closed at one end and provided in an interior of each support rod, and which communicates with the support grooves via communicating holes.

Water (processing liquid) that has collected in the support grooves and their vicinities can be removed by suction by vacuuming the support grooves through the water suction line, the central hole and the communicating holes. The water (processing liquid) that has been sucked in may be recovered in a processing tank. This can reduce the amount of water (processing liquid) brought out of the processing tank.

In a preferred aspect of the present invention, the electroless plating apparatus further comprises a liquid circulation line for circulating a processing liquid in at least one of the processing tanks.

In a preferred aspect of the present invention, the liquid intrusion prevention line is comprised of a pressurized fluid supply line for supplying a pressurized fluid into the central hole.

In a preferred aspect of the present invention, the communicating holes open onto surfaces to be plated of the substrates held by the substrate holder.

This can mainly remove water remaining in each support groove on the side of the surface to be plated of each substrate.

In a preferred aspect of the present invention, the electroless plating apparatus further comprises a control section for controlling a substrate immersion speed at which the substrates, held by the substrate holder, are immersed in a processing liquid in at least one of the processing tanks, and a substrate withdrawal speed at which the substrates are withdrawn from the processing liquid in the processing tank.

The control of the substrate immersion speed can reduce the time it takes to fully immerse the substrates, from the lower ends to the upper ends, in the processing liquid. The control of the substrate withdrawal speed can prevent a large amount of water from remaining on the substrates after withdrawal from the processing liquid.

In a preferred aspect of the present invention, the substrate immersion speed is not less than 100 mm/s, and the substrate withdrawal speed is not more than 50 mm/s.

In a preferred aspect of the present invention, the electroless plating apparatus further comprises a substrate movement mechanism for vibrating or vertically or horizontally swinging the substrate holder when immersing the substrates, held by the substrate holder, in a processing liquid in at least one of the processing tanks.

Diffusion of the processing liquid over the surface of each substrate can be promoted by immersing the substrates, held by the substrate holder, in the processing liquid while vibrating or vertically or horizontally swinging the substrate holder.

In a preferred aspect of the present invention, the electroless plating apparatus further comprises a pure water jet mechanism for jetting pure water toward the substrates, held by the substrate holder, after immersing the substrates in a processing liquid in at least one of the processing tanks and withdrawing the substrates from the processing liquid.

The jet cleaning of the substrates can further reduce the amount of the processing liquid adhering to the substrates and brought out of the processing tank.

The present invention also provides an electroless plating method comprising placing peripheral portions of a plurality of substrates in support grooves provided in support rods of a substrate holder so that the substrates are held in a vertical position and parallel to each other by the substrate holder; immersing the substrates, held by the substrate holder, in a first processing liquid in a first processing tank to carry out first processing, and withdrawing the substrates after the first processing from the first processing liquid; moving the substrate holder, holding the substrates, to a position just above a second processing tank; and immersing the substrates, held by the substrate holder, in a second processing liquid in the second processing tank to carry out second processing, and withdrawing the substrates after the second processing from the second processing liquid. Water that has collected in the support grooves and their vicinities is removed before, during or after the first or second processing.

In a preferred aspect of the present invention, water that has collected in the support grooves and their vicinities is removed before the substrates are held in a vertical position and parallel to each other by the substrate holder.

In a preferred aspect of the present invention, water that has collected in the support grooves and their vicinities is removed after the substrates are withdrawn from the first processing liquid or the second processing liquid.

In a preferred aspect of the present invention, the substrates are immersed in the first processing liquid or the second processing liquid at a speed of not less than 100 mm/s, and withdrawn from the first processing liquid or the second processing liquid at a speed of not more than 50 mm/s.

In a preferred aspect of the present invention, the substrates held by the substrate holder are immersed in the first processing liquid or the second processing liquid while vibrating or vertically or horizontally swinging the substrate holder.

The electroless plating apparatus and the electroless plating method of the present invention having the above constructions, despite using a high-productivity batch processing method, can minimize the amount of water brought from the preceding processing step, thereby making it possible to perform a sequence of successive processing steps in a stable and uniform manner.

In order to achieve the third object, the present invention provides yet another electroless plating apparatus comprising a plating tank for holding therein a plating solution while creating an upward flow of the plating solution; a substrate holder for holding a plurality of substrates in a vertical position and parallel to each other, and immersing the substrates in the plating solution in the plating tank; and a plurality of guide plates each for surrounding the periphery of each of the substrates, held by the substrate holder and immersed in the plating solution, and creating a flow of the plating solution around the periphery of the substrate, said flow being continuous with a flow of the plating solution flowing along a surface of the substrate.

By thus forming a flow of the plating solution, which is continuous with the flow of the plating solution flowing along a surface of each substrate, around the periphery of the substrate, it becomes possible to prevent the occurrence of flow turbulence in the plating solution around the periphery of each substrate. This makes it possible to form a plated film, having enhanced in-plane uniformity of the thickness and the shape, on the surface of each substrate.

In a preferred aspect of the present invention, the distance between each of the substrates held by the substrate holder and the guide plate, surrounding the periphery of the substrate, is 1 to 10 mm.

The distance between each substrate and each guide plate is desirably as small as possible, but in practice, it is preferably in the range of 1 to 10 mm in view of machining accuracy, etc.

In a preferred aspect of the present invention, the guide plates are connected by a plurality of connecting plates, each connecting adjacent two guide plates and extending linearly and vertically, to form a grid-like structure.

This can increase the strength and the stability of the guide plates while preventing the occurrence of flow turbulence in the plating solution flowing upwardly at the sides of the substrates.

In a preferred aspect of the present invention, the guide plates consist of lower guide plates for surrounding the peripheries of the lower halves of the substrates held by the substrate holder and immersed in the plating solution, and upper guide plates for surrounding the peripheries of the upper halves of the substrates, the lower guide plates being mounted to the substrate holder and the upper guide plates being mounted to the back surface of a lid for opening/closing the top opening of the plating tank.

In a preferred aspect of the present invention, the guide plates consist of lower guide plates for surrounding the peripheries of the lower halves of the substrates held by the substrate holder and immersed in the plating solution, and upper guide plates for surrounding the peripheries of the upper halves of the substrates, the lower guide plates being mounted to an interior surface of the plating tank and the upper guide plates being mounted to the back surface of a lid for opening/closing the top opening of the plating tank.

The thus-constructed electroless plating apparatus of the present invention can form a flow of a plating solution, which is continuous with the flow of the plating solution flowing along a surface of each substrate, around the periphery of the substrate. This makes it possible to prevent the occurrence of flow turbulence in the plating solution around the periphery of each substrate, thereby forming a plated film, having enhanced in-plane uniformity of the thickness and the shape, on the surface of each substrate.

DETAILED DESCRIPTION OF THE PREFERRED EMBODIMENTS

Figure 1:
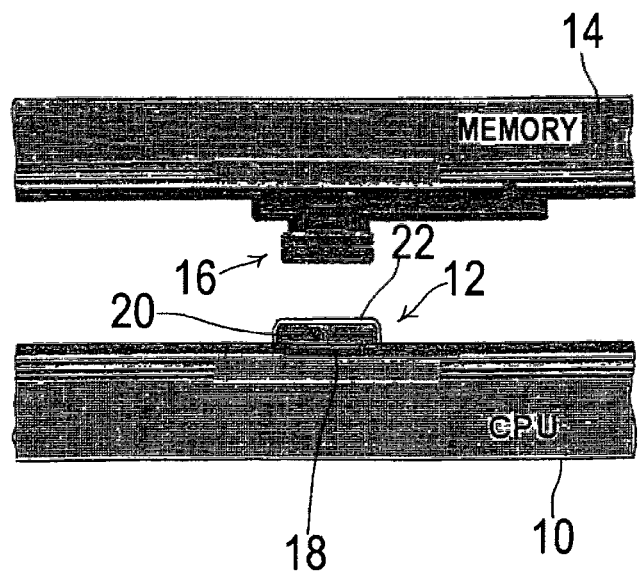
FIG. 1 is a cross-sectional view illustrating bonding of microbumps.
Figure 2:
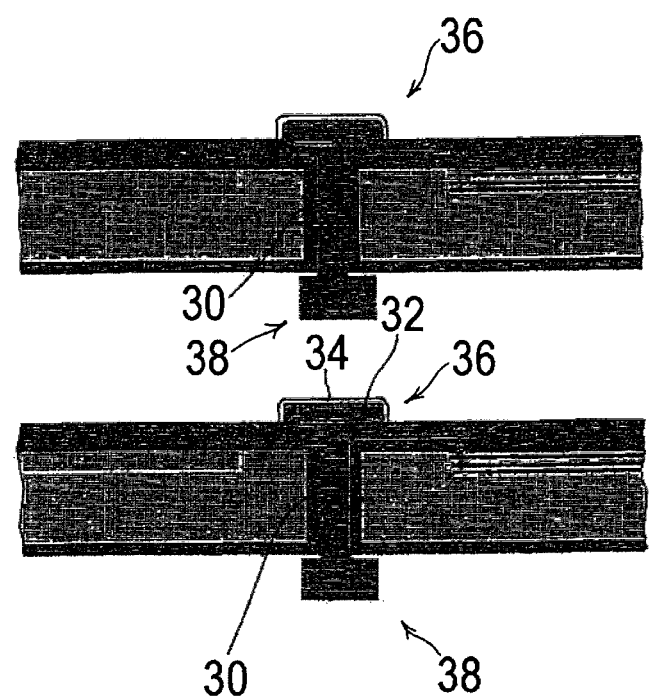
FIG. 2 is a cross-sectional view illustrating TSV bonding.
Figure 3:
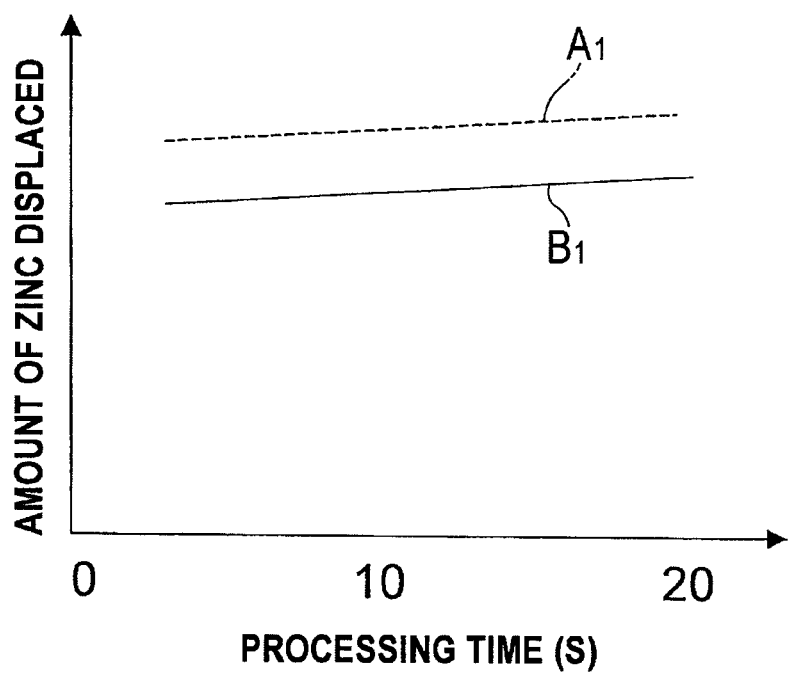
FIG. 3 is a graph showing the relationship between the amount of zinc displaced (plated) and the processing time (sec) in a zincate treatment of an Al surface.
Figure 4:
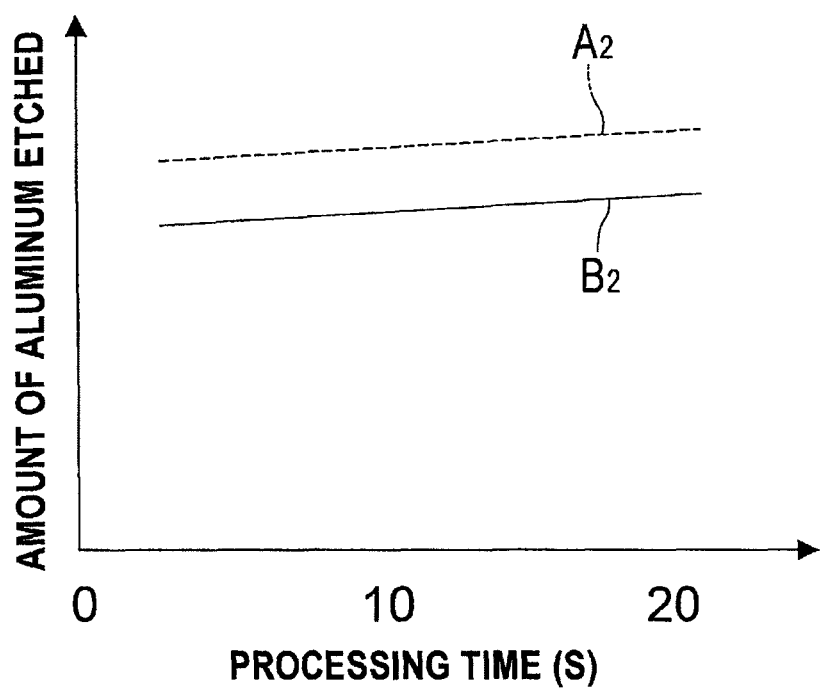
FIG. 4 is a graph showing the relationship between the amount of aluminum etched and the processing time (sec) in a zincate treatment of an Al surface.
Figure 5:
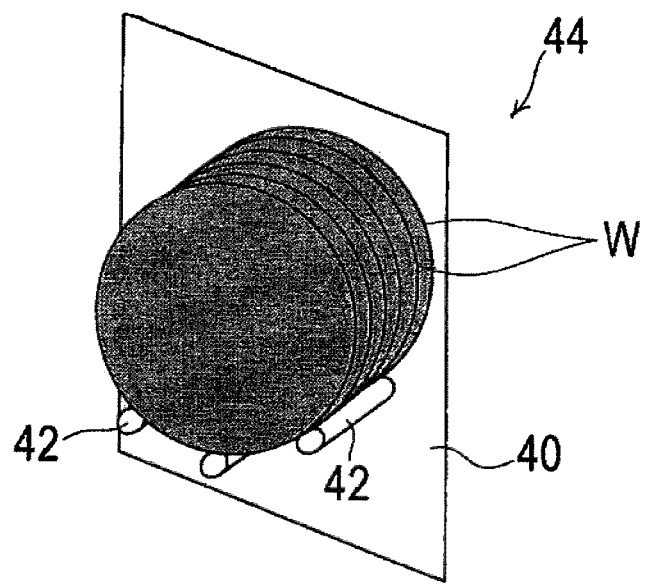
FIG. 5 is a perspective view of a substrate holder used in a conventional electroless plating apparatus.
Figure 6:
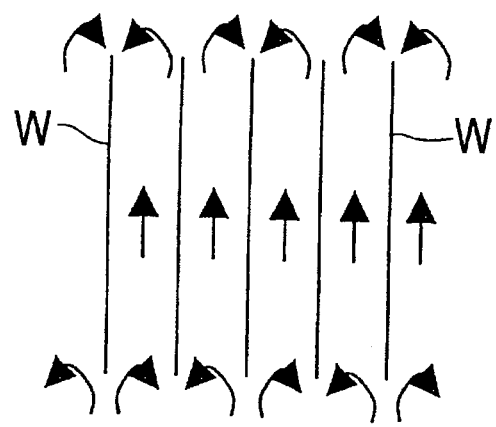
FIG. 6 is a diagram illustrating the flow of a plating solution as observed when substrates, held by the substrate holder shown in FIG. 5, are simultaneously immersed in the plating solution flowing upward.

Preferred embodiments of the present invention will now be described in detail with reference to the drawings. The same reference numerals will be used throughout the drawings and the description to refer to the same or like members, components, etc., and a duplicate description thereof will be omitted.

Figure 7A:
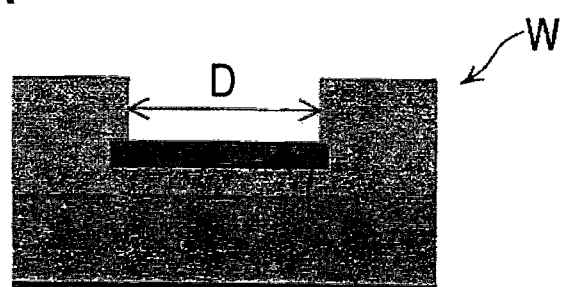
FIG. 7A is a cross-sectional view showing a substrate having a bump pad.
Figure 7B:
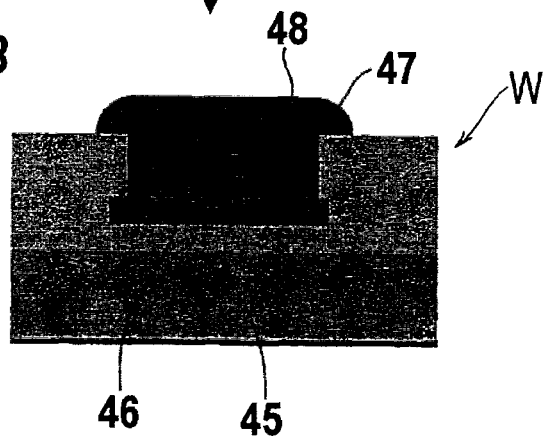
FIG. 7B is a cross-sectional view showing the substrate after forming an Ni plated film and an Au plated film on the bump pad by electroless plating.

The following description illustrates an exemplary case where a substrate W, such as a semiconductor wafer, having an Al bump pad 45, e.g., having a diameter D of several μm, is prepared, as shown in FIG. 7A and, as shown in FIG. 7B, a zinc plated film 46 is formed by displacement plating on a surface of the bump pad 45 by carrying out a zincate treatment as a pre-plating treatment on a surface of the substrate W, and an Ni plated film 47, e.g., having a thickness of 1.6 μm, is formed by electroless plating on a surface of the zinc plated film 46, and then an Au plated film 48, e.g., having a thickness of 0.1 μm, is formed by displacement plating (electroless plating) on a surface of the Ni plated film 47.

Figure 8:
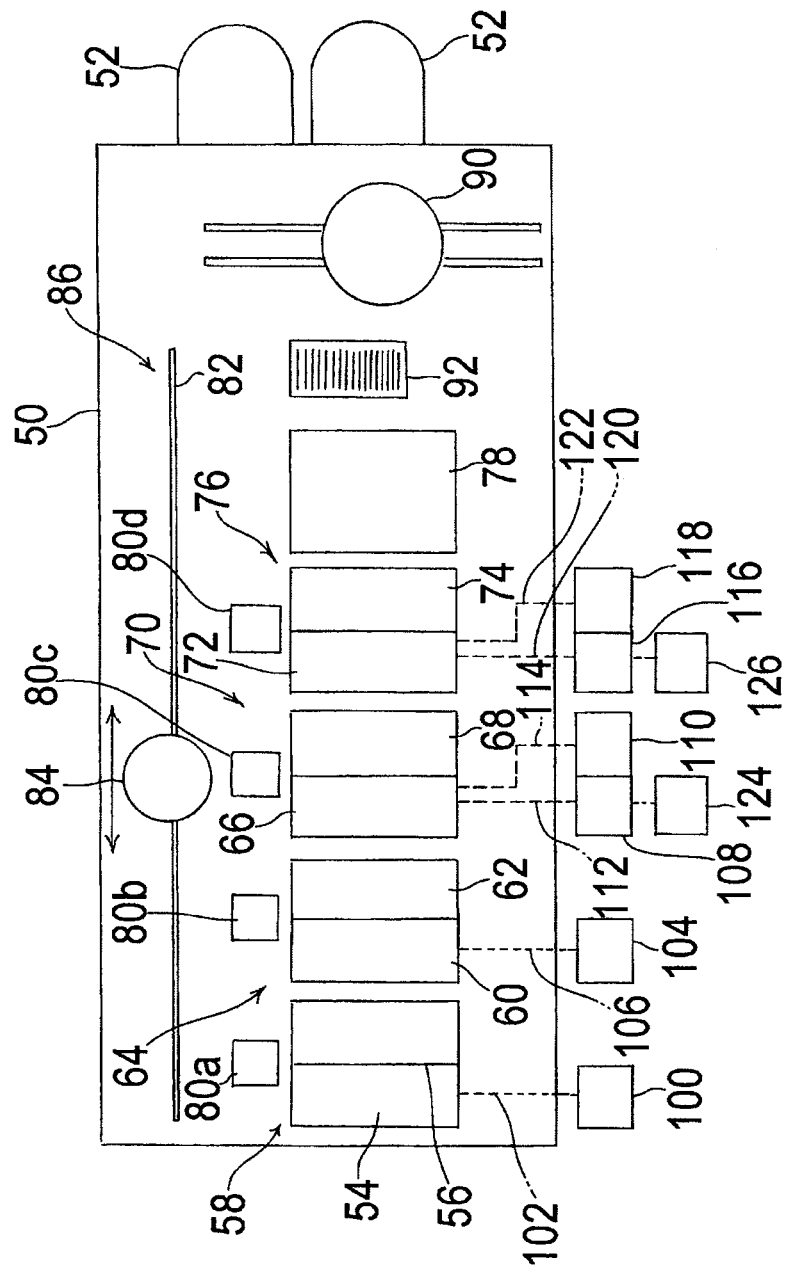
FIG. 8 is an overall plan view of an electroless plating apparatus according to an embodiment of the present invention.

FIG. 8 is an overall plan view schematically showing the construction of an electroless plating apparatus according to an embodiment of the present invention. As shown in FIG. 8, the electroless plating apparatus includes a generally-rectangular housing 50 having an air conditioning function for creating a downward air flow, and loading ports 52, disposed adjacent to the housing 50, each for placing thereon a substrate cassette for storing a large number of substrates, such as semiconductor wafers. The loading port 52 can be mounted with an open cassette, a SMIF (standard mechanical interface) pod or a FOUP (front opening unified pod).

In the housing 50 are arranged in series, starting from the module farthest from the loading ports 52, a pre-cleaning module 58 including a pre-cleaning tank 54 and a water-cleaning tank 56, a zincate treatment (pre-plating treatment) module 64 including a zincate treatment tank (pre-plating treatment tank) 60 for carrying out a zincate treatment as a pre-plating treatment and a water-cleaning tank 62, an Ni plating module 70 including an Ni plating tank 66 and a water-cleaning tank 68, an Au plating module 76 including an Au plating tank 72 and a water-cleaning tank 74, and a drying unit 78.

The pre-cleaning module 58 is provided with a vertically and horizontally movable substrate holder 80a for transporting a plurality of substrates between the pre-cleaning tank 54 and the water-cleaning tank 56, and immersing the substrates in a processing liquid in the pre-cleaning tank 54 and a processing liquid in the water-cleaning tank 56. Similarly, the zincate treatment module 64 is provided with a substrate holder 80b for transporting the substrates between the zincate treatment tank 60 and the water-cleaning tank 62, the Ni plating module 70 is provided with a substrate holder 80c for transporting the substrates between the Ni plating tank 66 and the water-cleaning tank 68, and the Au plating module 76 is provided with a substrate holder 80d for transporting the substrates between the Au plating tank 72 and the water-cleaning tank 74.

At least one of the zincate treatment tank 60 and the water-cleaning tank 62 both of the zincate treatment module 64, the water-cleaning tank 68 of the Ni plating module 70 and the water-cleaning tank 74 of the Au plating module 76 preferably has a QDR (quick dump rinse) function. The provision of a QDR function makes it possible to rinse (clean) a substrate surface with water sufficiently in a short time and enables downsizing of the apparatus.

An inter-module substrate transport device 86, including a substrate holding tool 84, which is movable along a guide 82, is disposed parallel to the substrate holders 80a-80d and the drying unit 78 for transferring a plurality of substrates between the substrate holders 80a-80d and the drying unit 78.

By thus providing the substrate holders 80a-80d in the processing modules 58, 64, 70 and 76, respectively, separately from the inter-module substrate transport device 86, the construction of the substrate holders 80a-80d can be simplified. This can reduce the amount of a liquid chemical, including a plating solution, brought out of a processing tank, and can reduce the cleaning time in a cleaning step, thereby increasing the throughput. The substrate holders 80a-80d are each provided with a substrate movement mechanism for vertically moving or vibrating substrates as necessary.

In this embodiment, the inter-module substrate transport device 86 is used also to transport substrates, held by the substrate holding tool 84, to the drying unit 78 to dry the substrates.

In the housing 50 and beside the loading ports 52 is disposed a movable substrate carry-in/carry-out transport device 90 for simultaneously carrying substrates from the loading ports 52 into the housing 50, or simultaneously carrying substrates from the housing 50 to the loading ports 52. A substrate station 92 for temporarily placing substrates thereon is disposed between the substrate carry-in/carry-out transport device 90 and the drying unit 78.

The substrate carry-in/carry-out transport device 90 simultaneously receives, e.g., 25 substrates stored in the loading ports 52 and transports the substrates to the substrate station 92, where the substrates are temporarily placed in a vertical position. This operation is repeated twice so that, e.g., 50 substrates are temporary placed in a vertical position on the substrate station 92. The inter-module substrate transport device 86 simultaneously receives, e.g., 50 substrates from the substrate station 92, transports the substrates to the pre-cleaning module 58 and simultaneously transfers the substrates to the substrate holder 80*a* of the pre-cleaning module 58. On the other hand, substrates after processing are temporarily placed on the substrate station 92 and, by the reverse operation to the above-described operation, are returned to the loading ports 52 by the substrate carry-in/carry-out transport device 90.

In this embodiment, the pre-cleaning tank 54 uses nitric acid as a pre-cleaning liquid to remove a surface oxide film from a substrate W, and to remove a surface of a zinc plated film formed by displacement plating on a surface of a bump pad 45 (see FIG. 7A) during a double zincate treatment. A pre-cleaning liquid (nitric acid) storage tank 100 for storing the pre-cleaning liquid (nitric acid) is disposed outside the housing 50, and a pre-cleaning liquid supply line 102 extending from the pre-cleaning liquid storage tank 100 is connected to the pre-cleaning tank 54.

A zincate solution storage tank 104 for storing a zincate solution, e.g., a sodium hydroxide-based solution containing zinc oxide, is disposed outside the housing 50, and a zincate solution supply line 106 extending from the zincate solution storage tank 104 is connected to the zincate treatment tank 60.

An Ni plating solution storage tank 108 for storing an Ni plating solution, and a flushing liquid storage tank 110 for storing a flushing liquid (etching liquid), which is nitric acid in this embodiment, for use in the below-described flushing are disposed outside the housing 50, and an Ni plating solution supply line 112 extending from the Ni plating solution storage tank 108 and a flushing line 114 extending from the flushing liquid storage tank 110 are connected to the Ni plating tank 66.

Further, an Au plating solution storage tank 116 for storing an Au plating solution, and a flushing liquid storage tank 118 for storing a flushing liquid (etching liquid), which is a mixture of nitric acid and hydrochloric acid in this embodiment, for use in the below-described flushing are disposed outside the housing 50, and an Au plating solution supply line 120 extending from the Au plating solution storage tank 116 and a flushing line 122 extending from the flushing liquid storage tank 118 are connected to the Au plating tank 72.

The Ni plating solution storage tank 108 is provided with a plating solution analyzer 124 for analyzing an Ni plating solution to measure the metal (Ni) ion concentration, the pH, etc. of the Ni plating solution. Similarly, the Au plating solution storage tank 116 is provided with a plating solution analyzer 126 for analyzing an Au plating solution to measure the metal (Au) ion concentration, the pH, etc. of the Au plating solution.

Figure 9:
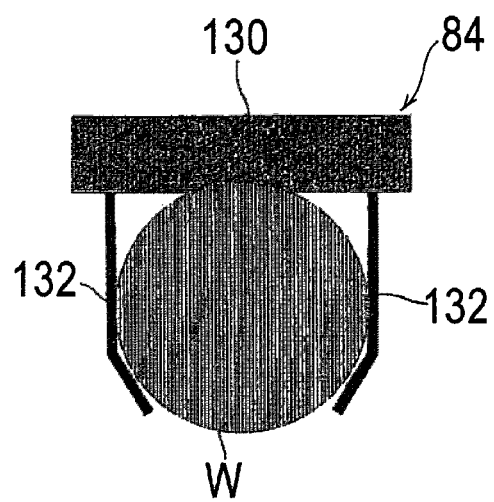
FIG. 9 is a schematic front view of a substrate holding tool of an inter-module substrate transport device.
Figure 10:
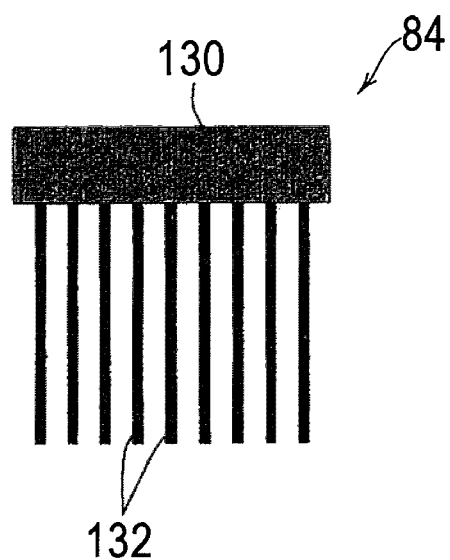
FIG. 10 is a right side view of the substrate holding tool of FIG. 9.

FIG. 9 is a schematic front view of the substrate holding tool 84 of the inter-module substrate transport device 86, and FIG. 10 is a schematic right side view of the substrate holding tool 84. As shown in FIGS. 9 and 10, the substrate holding tool 84 includes a base portion 130 and pairs of openable/closable transport arms 132. The transport arms 132 in the open state are lowered from above a plurality of (e.g., 50) substrates W, arranged in a vertical position and parallel to each other, and the substrate holding tool 84 simultaneously grasps the substrates W by closing the transport arms 132. The holding of the substrates W is released by the reverse operation. To prevent contamination in each tank, the transport arms 132 are cleaned at a proper time.

Figure 11:
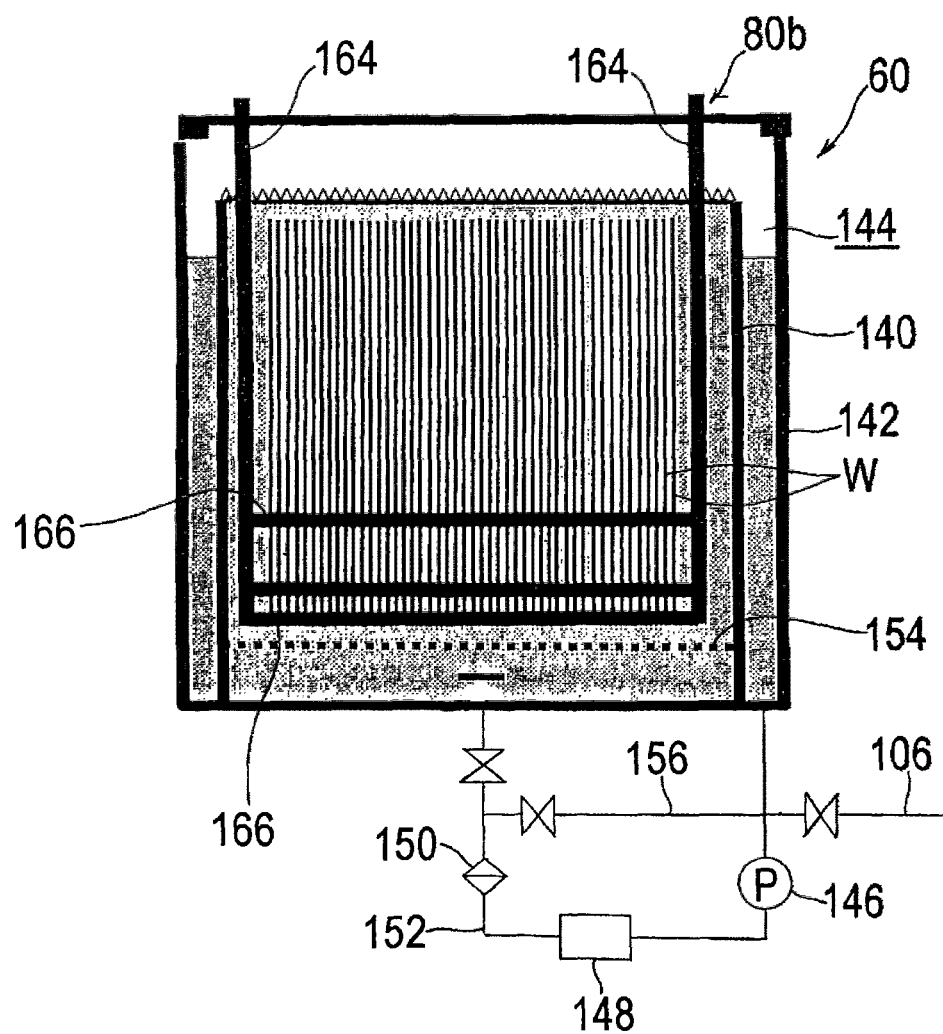
FIG. 11 is a schematic vertical sectional front view showing a zincate treatment tank and a substrate holder of a zincate treatment module.
Figure 12:
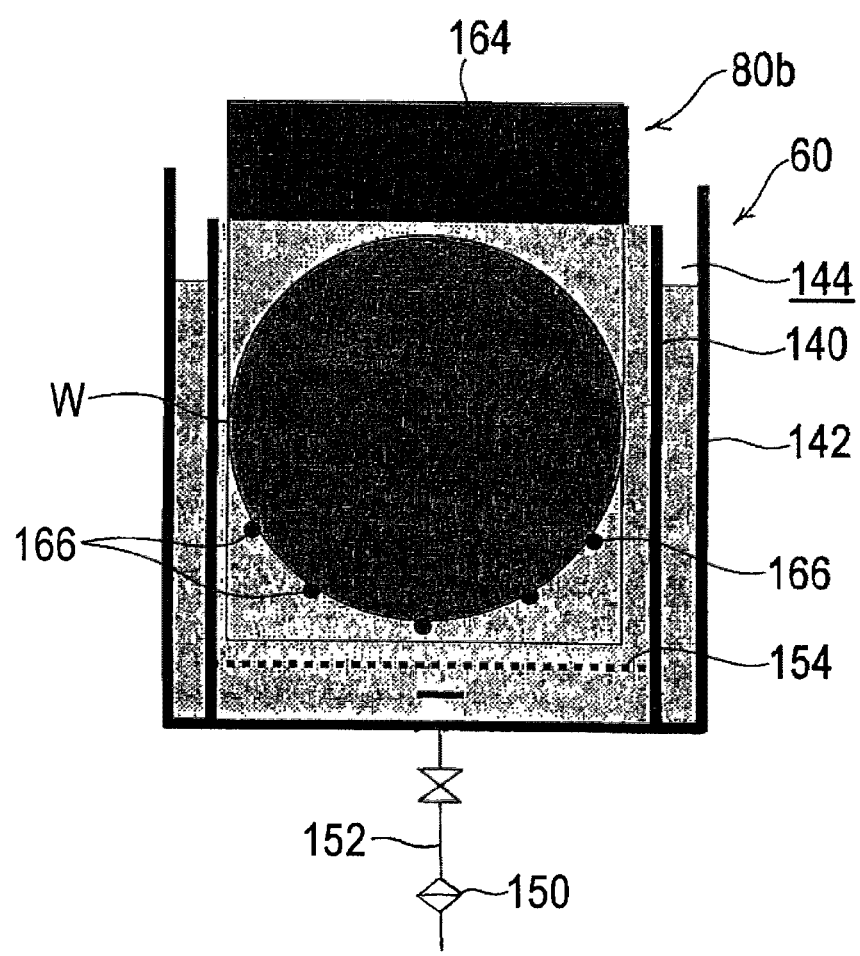
FIG. 12 is a schematic sectional side view showing the zincate treatment tank and the substrate holder of the zincate treatment module.

FIG. 11 is a schematic vertical sectional front view showing the zincate treatment tank 60 and the substrate holder 80*b* of the zincate treatment module 64, and FIG. 12 is a schematic sectional side view showing the zincate treatment tank 60 and the substrate holder 80*b* of the zincate treatment module 64.

As shown in FIGS. 11 and 12, the zincate treatment tank 60 includes an inner tank 140 and an outer tank 142, with an overflow tank 144 being formed between the inner tank 140 and the outer tank 142. To the bottom of the overflow tank 144 of the zincate treatment tank 60 is connected one end of a zincate solution (pre-plating treatment solution) circulation line 152 having a pump 146, a temperature controller 148 and a filter 150. The other end of the zincate solution circulation line 152 is connected to the bottom of the inner tank 140. A straightening plate 154 for straightening the flow of the zincate solution is disposed at the bottom of the inner tank 140.

By the actuation of the pump 146, the zincate solution in the zincate treatment tank 60 is circulated through the zincate solution circulation line 152, the inner tank 140 and the overflow tank 144 while the zincate solution is filtered by the filter 150 and controlled, e.g., at 50° C. by the temperature controller 148. In the zincate solution circulation line 152, the upstream side of the pump 146 and the downstream side of the filter 150 are connected by a short-circuit line 156. The above-described zincate solution supply line 106 extending from the zincate solution storage tank 104 is connected to the zincate solution circulation line 152.

The pre-cleaning tank 54 has a similar construction to the zincate treatment tank 60. However, the temperature controller 148 may be omitted in the pre-cleaning tank 54 because the processing liquid (nitric acid) generally does not need control of its temperature (generally used at room temperature).

As shown in FIGS. 11 and 12, the substrate holder 80*b* includes a pair of side plates 164 located in opposite positions at a predetermined distance from each other, and a plurality of support rods 166, extending between the side plates 164, for supporting peripheral portions of substrates W from below.

The substrate holder 80*b* of the zincate treatment module 64 can support the lower sides of a plurality of (e.g., 50) substrates W on the support rods 166, so that the substrates W can be smoothly transferred between the substrate holder 80*b* and the substrate holding tool 84 of the inter-module substrate transport device 86, which grips the substrates W from above. The other substrate holders 80*a*, 80*c*, 80*d* have the same construction as the substrate holder 80*b*.

Figure 13:
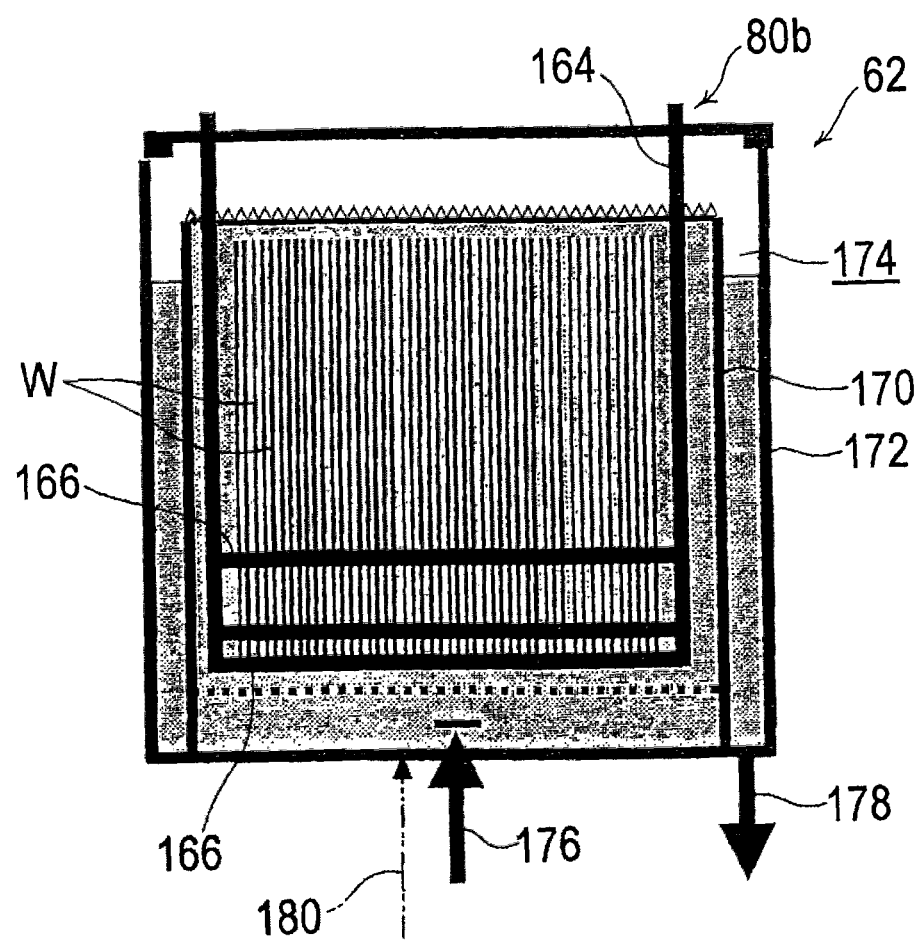
FIG. 13 is a schematic vertical sectional front view showing a water-cleaning tank and the substrate holder of the zincate treatment module.

FIG. 13 is a schematic vertical sectional front view showing the water-cleaning tank 62 and the substrate holder 80*b* of the zincate treatment module 64. The water-cleaning tank 62 uses pure water as a processing liquid. The water-cleaning tank 62 includes an inner tank 170 and an outer tank 172, with an overflow tank 174 being formed between the inner tank 170 and the outer tank 172. A pure water supply line 176 is connected to the bottom of the inner tank 170, and a water discharge line 178 is connected to the bottom of the overflow tank 174. Pure water, which has been supplied through the pure water supply line 176 into the inner tank 170, fills the inner tank 170, and then overflows the inner tank 170 and flows into the overflow tank 174, and is discharged through the water discharge line 178.

The other water-cleaning tanks 56, 68, 74 have the same construction as the water-cleaning tank 62. As shown by the imaginary line in FIG. 13, in the case of the water-cleaning tanks 68, 74 of the plating modules 70, 76, a liquid chemical supply line 180 for supplying a liquid chemical for removing an oxide film from a surface of a plated film may be connected to the bottom of the inner tank 170.

Figure 14:
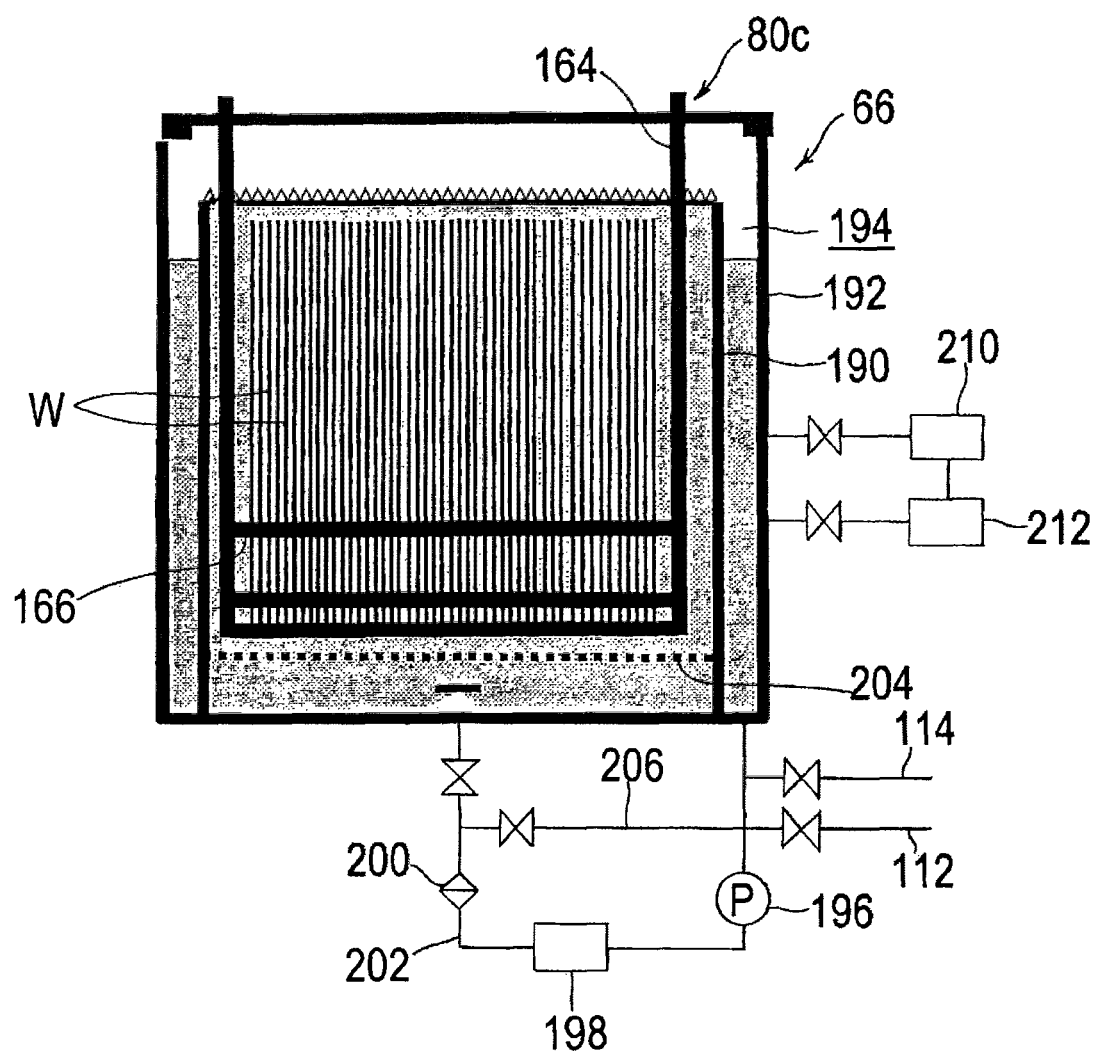
FIG. 14 is a schematic vertical sectional front view showing an Ni plating tank and a substrate holder of an Ni plating module.

FIG. 14 is a schematic vertical sectional front view showing the Ni plating tank 66 and the substrate holder 80*c* of the Ni plating module 70. As described above, the substrate holder 80*c* has the same construction as the above-described substrate holder 80*b*. The same reference numerals will therefore be used for the same members or components, and a duplicate description thereof will be omitted.

As shown in FIG. 14, the Ni plating tank 66 includes an inner tank 190 and an outer tank 192, with an overflow tank 194 being formed between the inner tank 190 and the outer tank 192. To the bottom of the overflow tank 194 of the Ni plating tank 66 is connected one end of a plating solution circulation line 202 having a pump 196, a temperature controller 198 and a filter 200. The other end of the plating solution circulation line 202 is connected to the bottom of the inner tank 190. To the bottom of the inner tank 190 is also connected a straightening plate 204 for straightening the flow of an Ni plating solution.

By the actuation of the pump 196, the plating solution in the Ni plating tank 66 is circulated through the plating solution circulation line 202, the inner tank 190 and the overflow tank 194 while the plating solution is filtered by the filter 200 and controlled, e.g., at 80° C. by the temperature controller 198. In the plating solution circulation line 202, the upstream side of the pump 196 and the downstream side of the filter 200 are connected by a short-circuit line 206.

The above-described Ni plating solution supply line 112 extending from the Ni plating solution storage tank 108 and the above-described flushing line 114 extending from the flushing liquid storage tank 110 are connected to the plating solution circulation line 152. After removing the Ni plating solution from the Ni plating tank 66 and the plating solution circulation line 202, the interior of the plating solution circulation line 202 and the interior of the Ni plating solution storage tank 108 can be flushed with a flushing liquid (flushing liquid) by introducing the flushing liquid (etching liquid), such as nitric acid, into the Ni plating solution storage tank 108 through the flushing line 114 and the plating solution circulation line 202, and circulating the flushing liquid by the pump 196.

The overflow tank 194 is provided with a plating solution analyzer 210 for analyzing the Ni plating solution in the overflow tank 194 to measure the metal (Ni) ion concentration, the pH, etc. of the Ni plating solution, and a plating solution replenishing device 212 for supplying a replenisher solution having a predetermined metal concentration to the Ni plating solution in the overflow tank 194 based on the results of analysis by the plating solution analyzer 210.

The Au plating tank 72 has a similar construction to the Ni plating tank 66, except that the temperature of an Au plating solution in the Au plating tank 72 is controlled, e.g., at 75° C.

Figure 15:
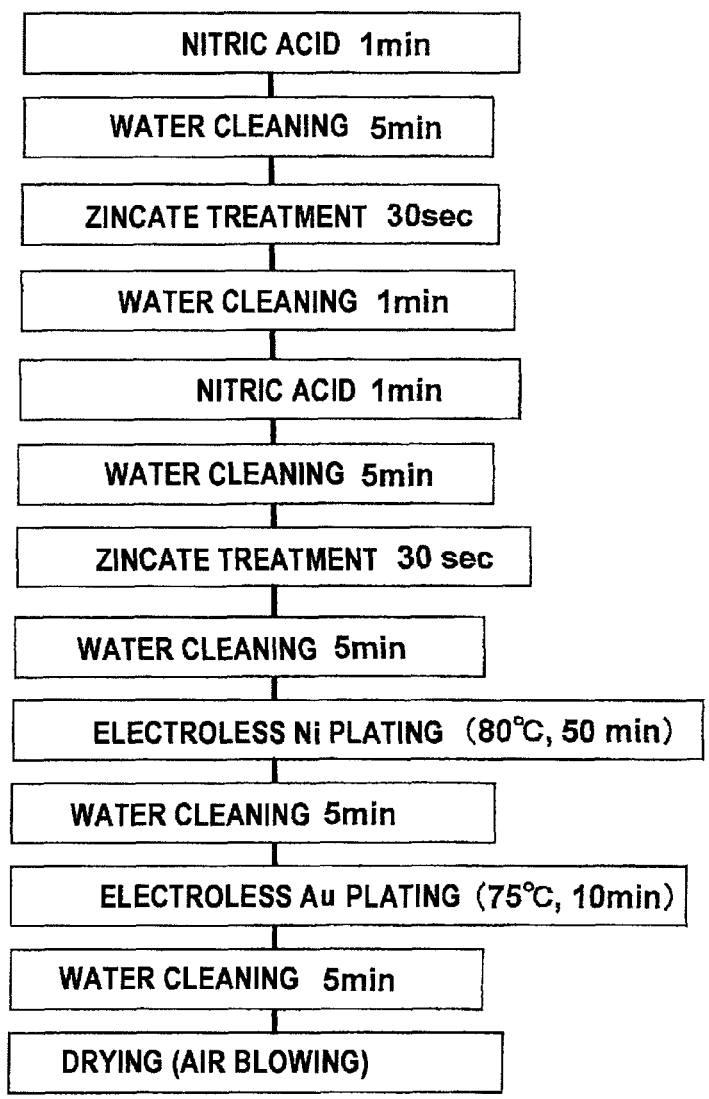
FIG. 15 is a flow chart showing a sequence of processing steps performed by the electroless plating apparatus shown in FIG. 8.

A sequence of processing steps performed by the electroless plating apparatus shown in FIG. 8 will now be described with reference also to FIG. 15.

First, as described above, a plurality of (e.g., 50) substrates W, which have been temporarily placed on the substrate station 92, are grasped from above by the substrate holding tool 84 of the inter-module substrate transport device 86, and the substrates W are transported to the pre-cleaning module 58. The substrate holder 80a of the pre-cleaning module 58 simultaneously receives the substrates W from the substrate holding tool 84 of the inter-module substrate transport device 86 and holds the substrates W each in a vertical position. At this moment, the substrate holder 80a lies just above the pre-cleaning tank 54.

The substrate holder 80a is then lowered to immerse the substrates W, held by the substrate holder 80a, in a processing liquid (nitric acid) in the pre-cleaning tank 54. The substrates W are kept immersed in the processing liquid, e.g., for one minute to remove an oxide film from the surface of each substrate W.

Next, the substrates W, held by the substrate holder 80a, are withdrawn from the processing liquid (nitric acid) in the pre-cleaning tank 54, and are moved to a position just above the water-cleaning tank 56. The substrate holder 80a is then lowered to immerse the substrates W, held by the substrate holder 80a, in a processing liquid (pure water) in the water-cleaning tank 56. The substrates W are kept immersed in the processing liquid (pure water), e.g., for 5 minutes to clean the surface of each substrate W with water. Thereafter, the substrates W, held by the substrate holder 80a, are withdrawn from the processing liquid (pure water) in the water-cleaning tank 56.

Next, the substrates W, held in a vertical position by the substrate holder 80a, are transferred via the substrate holding tool 84 of the inter-module substrate transport device 86 to the substrate holder 80b of the zincate treatment module 64. The substrate holder 80b lies just above the zincate treatment tank 60.

Next, the substrate holder 80b is lowered to immerse the substrates W, held by the substrate holder 80b, in a processing liquid (zincate solution) in the zincate treatment tank 60. The substrates W are kept immersed in the processing liquid, e.g., for 30 seconds to carry out a first zincate treatment of a surface of an Al bump pad 45 (see FIG. 7A) of each substrate W. Thereafter, the substrates W, held by the substrate holder 80b, are withdrawn from the processing liquid (zincate solution) in the zincate treatment tank 60.

Next, the substrates W, held by the substrate holder 80b, are moved to a position just above the water-cleaning tank 62. The substrate holder 80b is then lowered to immerse the substrates W, held by the substrate holder 80b, in a processing liquid (pure water) in the water-cleaning tank 62. The substrates W are kept immersed in the processing liquid (pure water), e.g., for one minute to clean the surface of each substrate W with water. Thereafter, the substrates W, held by the substrate holder 80b, are withdrawn from the processing liquid (pure water) in the water-cleaning tank 62.

The above-described cycle of processing steps: immersion of the substrates in nitric acid; the subsequent cleaning of the substrates with water; immersion of the substrates in the zincate solution; and the subsequent cleaning of the substrates with water, are repeated twice. Thus, the substrates are subjected to a double zincate treatment. Rough zinc (zinc plated film) is formed by the first zincate treatment on the surface of the Al bump pad 45 (see FIG. 7A) of each substrate. The zinc (zinc plated film) is removed by the second processing with nitric acid, and the surface of the bump pad 45 can be densely displaced by zinc by the second zincate treatment. A zinc plated film 46, as shown in FIG. 7B, is formed in this manner.

Next, the substrates W after the double zincate treatment are transferred via the substrate holding tool 84 of the inter-module substrate transport device 86 to the substrate holder 80c of the Ni plating module 70. The substrates W, held in a vertical position by the substrate holder 80c, are immersed in an Ni plating solution, e.g., at 80° C. in the Ni plating tank 66, e.g., for 50 minutes to form an Ni plated film 47, as shown in FIG. 7B. The substrates W after the Ni plating are cleaned with water by immersing the substrates in a processing liquid (pure water) in the water-cleaning tank 68, e.g., for 5 minutes.

Next, the substrates W after the Ni plating are transferred via the substrate holding tool 84 of the inter-module substrate transport device 86 to the substrate holder 80d of the Au plating module 76. The substrates W, held in a vertical position by the substrate holder 80d, are then immersed in an Au plating solution, e.g., at 75° C. in the Au plating tank 72, e.g., for 10 minutes to form an Au plated film 48, as shown in FIG.

7B. The substrates W after the Au plating are cleaned with water by immersing the substrates in a processing liquid (pure water) in the water-cleaning tank 74, e.g., for 5 minutes.

Next, the substrates W after the Au plating are held by the substrate holding tool 84 of the inter-module substrate transport device 86 and transported to the drying unit 78, where the substrates W are dried, e.g., by air blowing or by a drying method using an IPA (isopropyl alcohol) vapor.

The substrate holding tool 84 of the inter-module substrate transport device 86 transports the substrates W after drying to the substrate station 92 and places the substrates W on the substrate station 92. The substrates W on the substrate station 92 are returned by the substrate carry-in/carry-out transport device 90 to the loading ports 52. The sequence of the electroless plating processing steps is thus completed.

When electroless Ni plating is carried out in the above-described manner, using a batch processing method, substances such as Ni adhere to inside surfaces of the Ni plating tank 66 and the plating solution circulation line 202. It is therefore necessary to flush out such substances, adhering to the inside surfaces of the Ni plating tank 66 and the plating solution circulation line 202, e.g., with an etching liquid after processing of, e.g., 100 substrates.

In this embodiment, when the need of flushing arises, an Ni plating solution is removed from the Ni plating tank 66 and the plating solution circulation line 202, and flushing of the interior of the Ni plating tank 66 and the interior of the plating solution circulation line 202, e.g., with an etching liquid is performed by introducing a flushing liquid, for example nitric acid which is commonly used for etching of Ni, through the flushing line 114 into the Ni plating tank 66 and the plating solution circulation line 202 and circulating the flushing liquid through the circulation system. Flushing of the interior of the Ni plating tank 66 and the interior of the plating solution circulation line 202, e.g., with an etching liquid can thus be performed easily and quickly.

The same holds for the Au plating tank 72. However, in the case of the Au plating tank 72, a mixture of nitric acid and hydrochloric acid, which is commonly used for etching of Au, for example, may be used as a flushing liquid.

Figure 16:
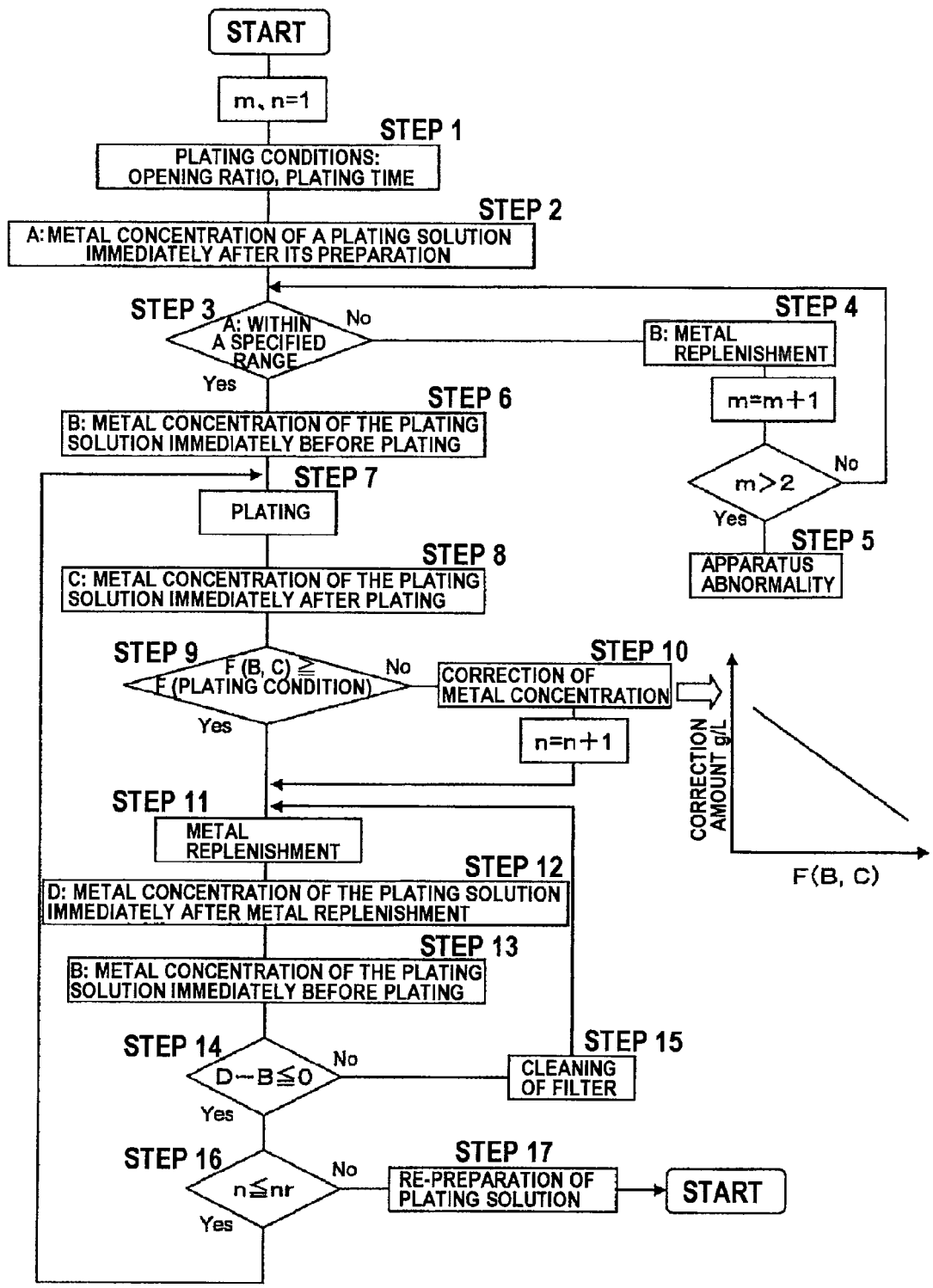
FIG. 16 is a flow chart illustrating the management of an Ni plating solution for use in electroless Ni plating.

Management of an Ni plating solution for use in electroless Ni plating will now be described with reference to the flow chart shown in FIG. 16.

First, plating conditions, such as a pattern opening ratio of a substrate and plating time, are set (step 1). The amount of metal deposited by plating can be determined, from a predetermined film forming rate, as a target amount F (plating condition) of metal deposited. Next, the metal concentration A of a plating solution upon its preparation is measured (step 2), and a determination is made as to whether the metal concentration A of the plating solution upon its preparation falls within a specified metal concentration range (step 3). If the metal concentration A of the plating solution upon its preparation does not fall within the specified range, the plating solution is replenished with the metal (step 4), and the process is returned to step 3. When the replenishment of the plating solution with the metal (step 4) is repeated twice, it is determined that there is an abnormality in the apparatus (step 5), and an alarm may be triggered.

If it is determined that the metal concentration A of the plating solution upon its preparation falls within the specified range, the metal concentration B of the plating solution immediately before plating is measured (step 6). Step 3 may be skipped when plating is carried out shortly after the preparation of the plating solution. Plating is actually carried out (step 7), and the metal concentration C of the plating solution immediately after plating is measured (step 8).

Next, the actual amount F (B, C) of metal actually deposited by plating is calculated from the concentration difference between the metal concentration B of the plating solution immediately before plating and the metal concentration C of the plating solution immediately after plating and from a known amount of the plating solution, and the actual amount F (B, C) of metal deposited thus calculated is compared with the target amount F (plating condition) of metal deposited (step 9). The degree of aging of the plating solution is determined by the comparison, and a decrease in the plating rate associated with the aging is corrected.

In particular, when the actual amount F (B, C) of metal deposited is lower than the target amount F (plating condition) of metal deposited (F (B, C)<F (plating condition)), the metal concentration of a replenisher solution is corrected to a value predetermined, e.g., by actual measurement (step 10). When the actual amount F (B, C) of metal deposited is equal to or higher than the target amount F (plating condition) of metal deposited (F (B, C)≥F (plating condition)), on the other hand, no correction is made to the metal concentration of the replenisher solution. The replenisher solution is supplied from the plating solution replenishing device 212 (see FIG. 14) to the plating solution according to the amount of metal deposited (step 11), and the metal concentration D of the plating solution immediately after the supply of the replenisher solution is measured (step 12). By managing the plating solution in this manner, the lifetime of the plating solution can be increased while minimizing a change in the plating rate.

When carrying out the next plating, the metal concentration B of the plating solution immediately before plating is re-measured (step 12). The difference is calculated between the metal concentration D of the plating solution immediately after the supply of the replenisher solution and the metal concentration B of the plating solution immediately before plating, and a determination is made as to whether the metal concentration of the plating solution has been decreasing with time (step 13). In particular, if the difference between the metal concentration D of the plating solution immediately after the supply of the replenisher solution and the metal concentration B of the plating solution immediately before plating is positive (D−B>0), it is determined that a certain amount of the plating metal has deposited in the plating apparatus (the Ni plating tank 66 and the plating solution circulation line 202). Therefore, the filter 200 (see FIG. 14) is cleaned, e.g., with an etching liquid (step 15), and the process is returned to step 11.

If the difference between the metal concentration D of the plating solution immediately after the supply of the replenisher solution and the metal concentration B of the plating solution immediately before plating is zero or negative (D−B≤0), a determination is made as to whether the number "n" of corrections to the metal concentration of the replenisher solution exceeds a predetermined number "nr" of corrections (step 16). If the number "n" of corrections does not exceed the predetermined number "nr" (n≤nr), the process is returned to step 7. If the number "n" of corrections exceeds the predetermined number "nr" (n>nr), a plating solution is re-prepared (step 17), and the process is returned to the start.

Thus, the plating amount (which can be converted to the thickness of plated film) is determined from the metal concentrations of a plating solution before and after plating and, according to the difference between the calculated plating amount and an estimated plating amount, a replenisher solution having a predetermined metal concentration is supplied to the plating solution. At this moment, the metal concentration of the plating solution may be either returned to the initial metal concentration or made higher than the initial metal concentration by supplying the replenisher solution to the plating solution. By managing the plating solution in the above-described manner, it becomes possible to prevent the plating rate from decreasing due to a factor other than the metal concentration of the plating solution and reduce a change in the thickness of a plated film as a whole, and to respond to an unexpected decrease in the plating rate.

FIGS. 17 through 23 are schematic vertical sectional front views of an electroless plating apparatus according to another embodiment of the present invention, illustrating the apparatus in sequence of process steps. As shown in FIGS. 17 through 23, the electroless plating apparatus comprises a pre-cleaning module 254 including a pre-cleaning tank 250 and a water-cleaning tank 252, a zincate treatment module 260 including a zincate treatment tank 256 and a water-cleaning tank 258, an Ni plating module 266 including an Ni plating tank 262 and a water-cleaning tank 264, an Au plating module 272 including an Au plating tank 268 and a water-cleaning tank 270, and a drying module 276 including a drying unit 274.

The pre-cleaning module 254 is provided with a vertically and horizontally movable substrate holder 280a for transporting a plurality of substrates between the pre-cleaning tank 250 and the water-cleaning tank 252. Similarly, the zincate treatment module 260 is provided with a substrate holder 280b, the Ni plating module 266 is provided with a substrate holder 280c, the Au plating module 272 is provided with a substrate holder 280d, and the drying module 276 is provided with a substrate holder 280e.

An inter-module substrate transport device 290, including a substrate holding tool 288 which is movable along a guide 286, is disposed parallel to the substrate holders 280a-280e for transferring a plurality of substrates between the substrate holders 280a-280e.

The substrate holder 280a is provided with a control section for controlling a substrate immersion speed at which substrates W, held by the substrate holder 280a, are immersed in a processing liquid in a processing tank, for example, at a speed of not less than 100 mm/s, and controlling a substrate withdrawal speed at which the substrates W, held by the substrate holder 280a, are withdrawn from the processing liquid in the processing tank, for example, at a speed of not more than 50 mm/s. The substrate holder 280a is also provided with a substrate movement mechanism for vibrating or vertically or horizontally swinging the substrate holder 280a when immersing substrates W, held by the substrate holder 280a, in a processing liquid in a processing tank. The provision of such control section and movement mechanism also holds for the substrate holders 280b, 280c and 280d.

The substrate holder 280a includes a pair of side plates 292a located in opposite positions at a predetermined distance from each other, and a plurality of support rods 294a, extending between the side plates 292a, for supporting peripheral portions of substrates W. Similarly, the substrate holder 280b includes a pair of side plates 292b and a plurality of support rods 294b, the substrate holder 280c includes a pair of side plates 292c and a plurality of support rods 294c, the substrate holder 280d includes a pair of side plates 292d and a plurality of support rods 294d, and the substrate holder 280e includes a pair of side plates 292e and a plurality of support rods 294e.

In this embodiment, above the Au plating tank 268 is disposed a pure water jet nozzle (not shown) for jetting pure water toward substrates W held by the substrate holder 280d, which have been withdrawn from a processing liquid (Au plating solution) in the Au plating tank 268.

Figure 24:
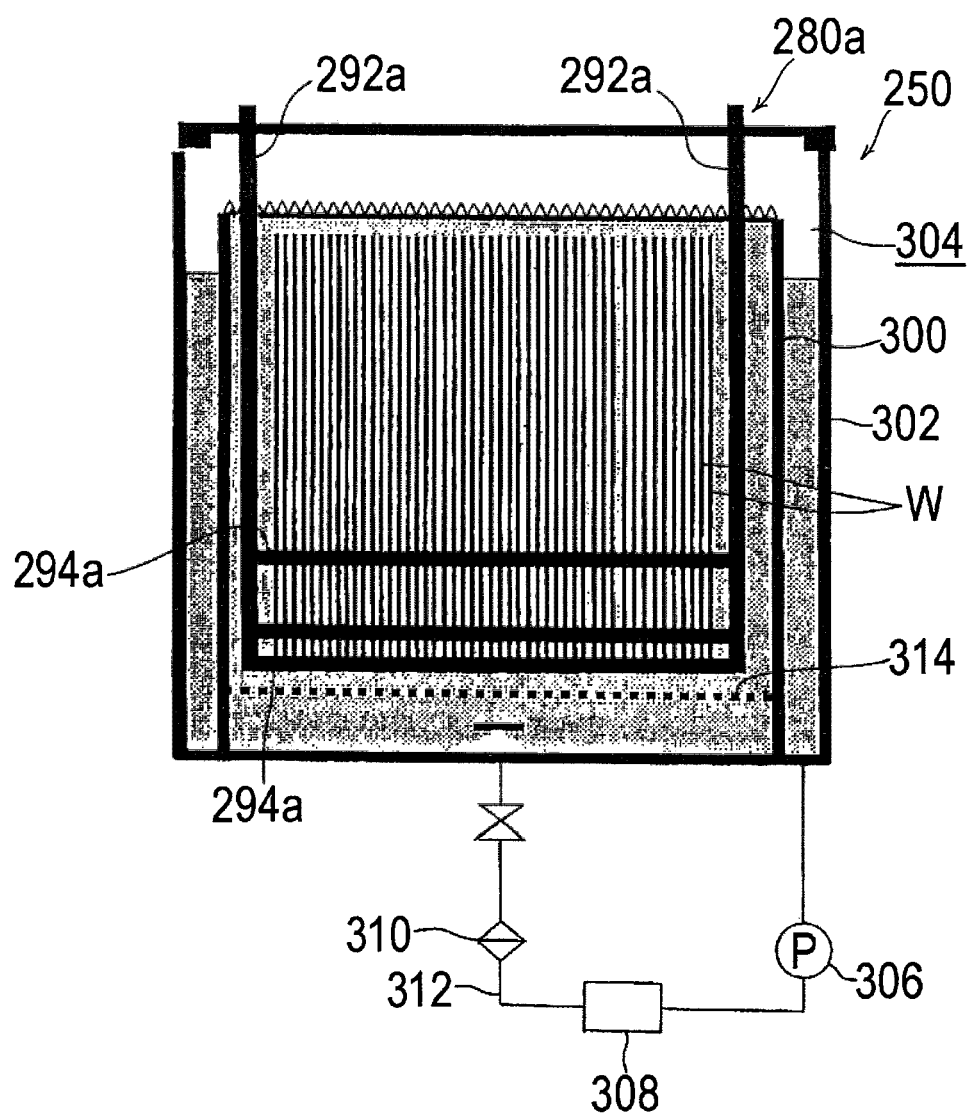
FIG. 24 is a schematic vertical sectional front view showing the pre-cleaning tank and the substrate holder of the pre-cleaning module.
Figure 25:
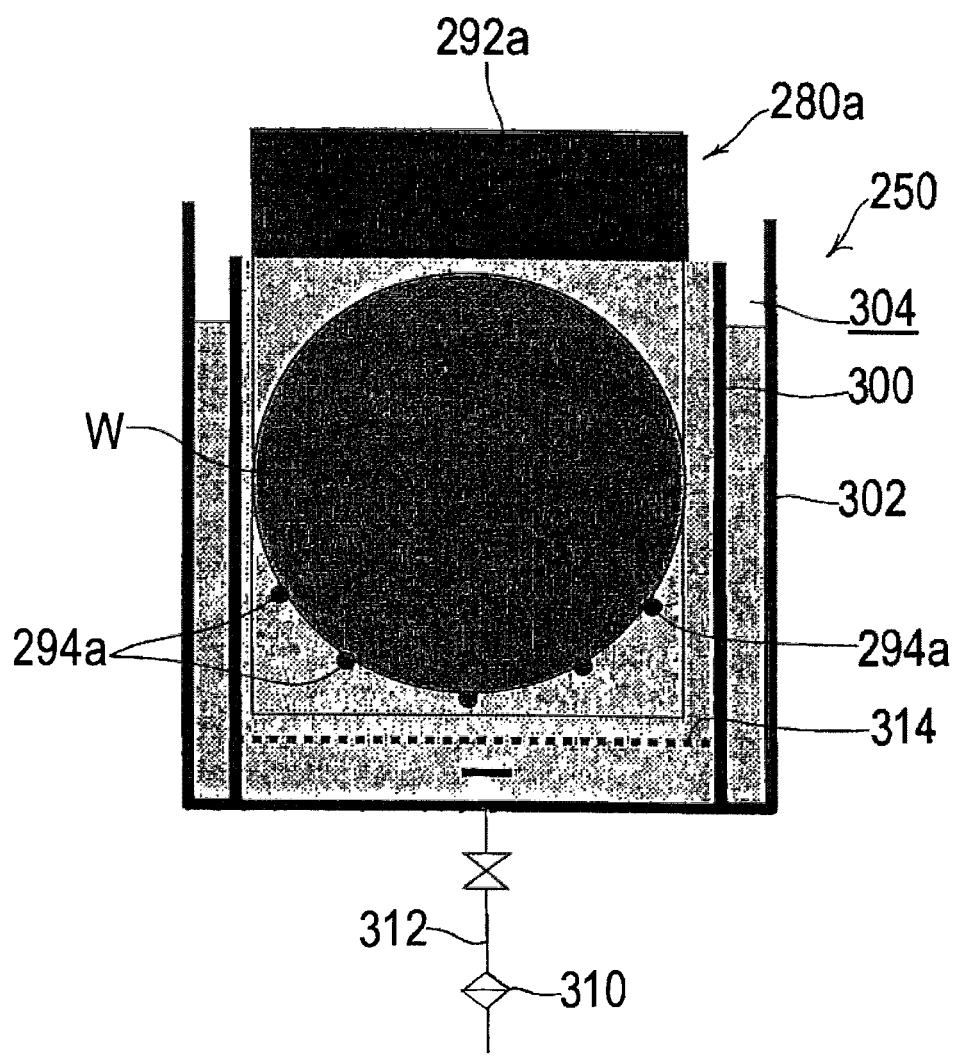
FIG. 25 is a schematic sectional side view showing the pre-cleaning tank and the substrate holder of the pre-cleaning module.

FIG. 24 is a schematic vertical sectional front view showing the pre-cleaning tank 250 and the substrate holder 280a of the pre-cleaning module 254, and FIG. 25 is a schematic sectional side view showing the pre-cleaning tank 250 and the substrate holder 280a of the pre-cleaning module 254. In this embodiment, the pre-cleaning tank 250 uses nitric acid as a processing liquid to remove a surface oxide film from a substrate W, and to remove the surface of a zinc plated film formed by displacement plating on a surface of a bump pad 45 (see FIG. 7A) during a double zincate treatment. The pre-cleaning tank 250 includes an inner tank 300 and an outer tank 302, with an overflow tank 304 being formed between the inner tank 300 and the outer tank 302. To the bottom of the overflow tank 304 of the pre-cleaning tank 250 is connected one end of a processing liquid circulation line 312 having a pump 306, a temperature controller 308 and a filter 310. The other end of the processing liquid circulation line 312 is connected to the bottom of the inner tank 300. A straightening plate 314 for straightening the flow of the processing liquid is disposed at the bottom of the inner tank 300.

By the actuation of the pump 306, the processing liquid (nitric acid) in the pre-cleaning tank 250 is circulated through the processing liquid circulation line 312, the inner tank 300 and the overflow tank 304 while the processing liquid is filtered by the filter 310 and, if necessary, controlled at a certain temperature by the temperature controller 308. The temperature controller 308 may be omitted because the processing liquid (nitric acid) in the pre-cleaning tank 250 generally does not need control of its temperature (generally used at room temperature).

Except for the use of different processing liquids, the zincate treatment tank 256, the Ni plating tank 262 and the Au plating tank 268 each have the same construction as the pre-cleaning tank 250. A zincate solution, e.g., a sodium hydroxide-based solution containing zinc oxide, is used as a processing liquid, e.g., at 50° C. in the zincate treatment tank 256. An Ni plating solution is used as a processing liquid, e.g., at 80° C. in the Ni plating tank 262. An Au plating solution is used as a processing liquid, e.g., at 75° C. in the Au plating tank 268.

Figure 26:
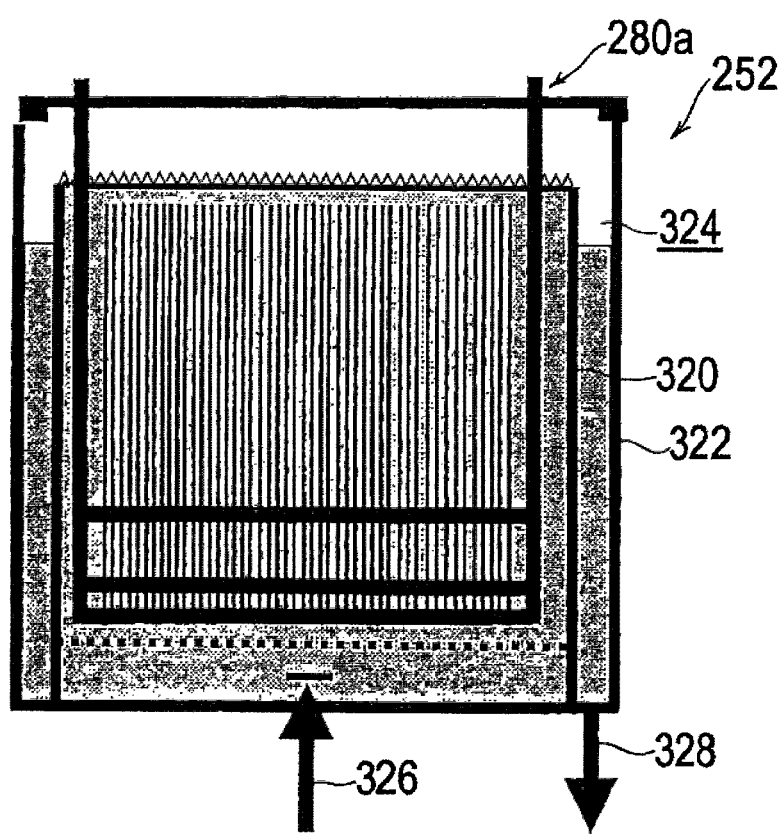
FIG. 26 is a schematic vertical sectional front view showing the water-cleaning tank and the substrate holder of the pre-cleaning module.

FIG. 26 is a schematic vertical sectional front view showing the water-cleaning tank 252 and the substrate holder 280a of the pre-cleaning module 254. The water-cleaning tank 252 uses pure water as a processing liquid. The water-cleaning tank 252 includes an inner tank 320 and an outer tank 322, with an overflow tank 324 being formed between the inner tank 320 and the outer tank 322. A pure water supply line 326 is connected to the bottom of the inner tank 320, and a water discharge line 328 is connected to the bottom of the overflow tank 324. Pure water, which has been supplied through the pure water supply line 326 into the inner tank 320, fills the inner tank 320, and then overflows the inner tank 320 and flows into the overflow tank 324, and is discharged through the water discharge line 328. Each of the other water-cleaning tanks 258, 264, 270 have the same construction as the water-cleaning tank 252.

Figure 27:
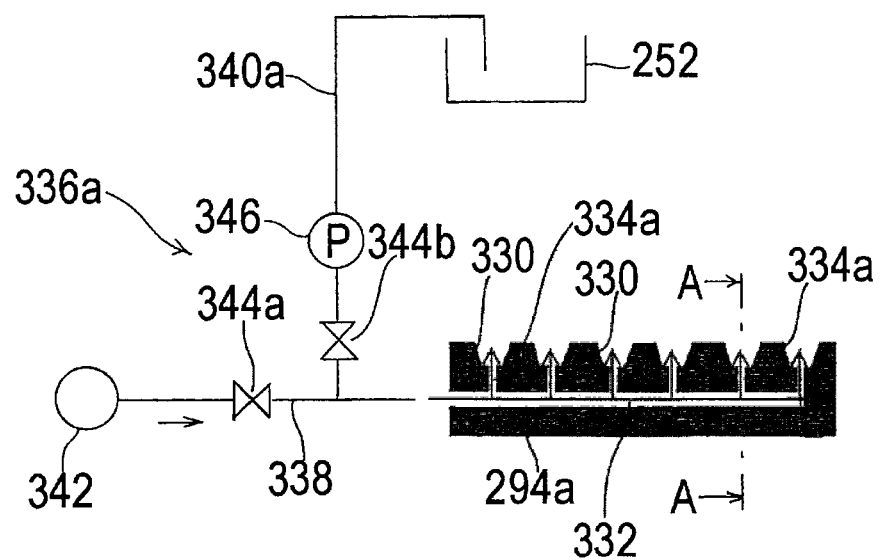
FIG. 27 is a schematic diagram showing, together with a water removal mechanism, an enlarged cross-section of a portion of a support rod provided in the substrate holder of the pre-cleaning module.
Figures 28A, 28B:
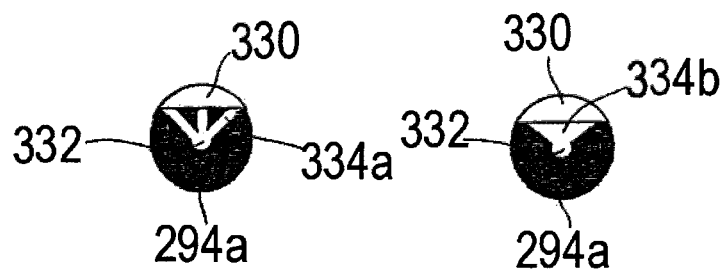
FIG. 28A is a cross-sectional view taken along line A-A of FIG. 27.
FIG. 28B is a cross-sectional view equivalent to FIG. 28A, showing a variation of the support rod.

FIG. 27 is a schematic diagram showing, together with a water removal mechanism, an enlarged cross-section of a portion of a support rod 294a provided in the substrate holder 280a of the pre-cleaning module 254. FIG. 28A is a cross-sectional view taken along line A-A of FIG. 27, and FIG. 28B is a cross-sectional view equivalent to FIG. 28A, showing a variation of the support rod.

As shown in FIGS. 27 and 28A, the support rod 294a has a plurality of support grooves 330 for placing therein peripheral portions of substrates W to support the substrates W in a vertical position. The support grooves 330 are arranged at a predetermined pitch, e.g., at a pitch of 5 mm, in the longitudinal direction of the support rod 294a. A central hole 332, closed at one end, is provided in the interior of the support rod 294a. The central hole 332 communicates with the support grooves 330 via communicating holes 334a each consisting of a plurality of holes. To the open end of the central hole 332 is connected a water removal mechanism 336a for removing water that has collected in the support grooves 330 and their vicinities.

The water removal mechanism 336a includes a pressurized gas supply line 338 and, in this embodiment, a liquid circulation line 340a for circulating a processing liquid through the central hole 332. The pressurized gas supply line 338 and the liquid circulation line 340a are to be selectively connected to the open end of the central hole 332 of the support rod 294a. The pressurized gas supply line 338 is connected to a pressurized gas supply source 342 for supplying, for example, high-pressure air, and has an on-off valve 344a provided anterior to the junction with the liquid circulation line 340a. The liquid circulation line 340a has a pump 346 and an on-off valve 344b provided anterior to the junction with the pressurized gas supply line 338, and opens, e.g., into the water-tank 252 as schematically shown in FIG. 27.

By closing the on-off valve 344b of the liquid circulation line 340a and opening the on-off valve 344a of the pressurized gas supply line 338, a high-pressure gas, such as air, is introduced into the central hole 332 and the communicating holes 334a of the support rod 294a, and jetted in the support grooves 330 to blow off water that has collected in the support grooves 330 and their vicinities. The removal of water may be performed either when substrates W are not supported or supported with their peripheral portions placed in the support grooves 330.

When, for example, substrates W held by the substrate holder 280a are immersed in a processing liquid (pure water) in the water-cleaning tank 252 for water cleaning of the substrates W, the on-off valve 344b of the liquid circulation line 340a is opened and the on-off valve 344a of the pressurized gas supply line 338 is closed. This allows the processing liquid (pure water) in the water-cleaning tank 252 to pass through the central hole 332 of the support rod 294a and return to the water-cleaning tank 252 in a circulatory manner. The interiors of the communicating holes 334a and the central hole 332 can be cleaned by thus allowing the processing liquid (pure water) in the water-cleaning tank 252 to circulate through the communicating holes 334a and the central hole 332.

In this embodiment, as shown in FIG. 28A, in the support rod 294a of the substrate holder 280a, the central hole 332 communicates with each support groove 330 via each communicating hole 334a consisting of a plurality of holes. However, as shown in FIG. 28B, the central hole 332 may communicate with each support groove 330 via a fan-shaped slit-like communicating hole 334b. This holds for the support rods 294b-294d of the substrate holders 280b-280d. It is possible to omit the communicating holes 334a: the central hole 332 may communicate directly with each support groove 330.

Figure 29:
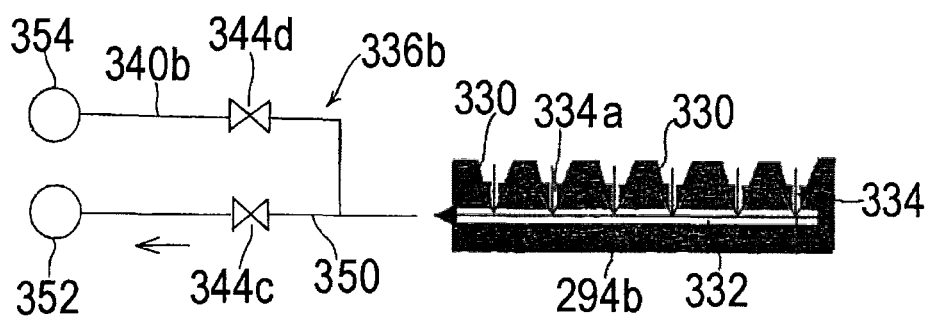
FIG. 29 is a schematic diagram showing, together with a water removal mechanism, an enlarged cross-section of a portion of a support rod provided in the substrate holder of the zincate treatment module.

FIG. 29 is a schematic diagram showing, together with a water removal mechanism, an enlarged cross-section of a portion of a support rod 294b provided in the substrate holder 280b of the zincate treatment module 260. As with the above-described support rod 294a, the support rod 294b has a plurality of support grooves 330 for placing therein peripheral portions of substrates W to support the substrates W in a vertical position, as shown in FIG. 29. A central hole 332, closed at one end, is provided in the interior of the support rod 294b. The central hole 332 communicates with the support grooves 330 via communicating holes 334a each consisting of a plurality of holes. To the open end of the central hole 332 is connected a water removal mechanism 336b for removing water that has collected in the support grooves 330 and their vicinities.

The water removal mechanism 336b includes a water suction line 350 and, in this embodiment, a liquid intrusion prevention line 340b which is a pressurized fluid supply line. The water suction line 350 and the liquid intrusion prevention line 340b are to be selectively connected to the open end of the central hole 332 of the support rod 294b. The water suction line 350 is connected to a water suction source 352, for example, a vacuum pump, and has an on-off valve 344c provided anterior to the junction with the liquid intrusion prevention line (pressurized fluid supply line) 340b. The liquid intrusion prevention line 340b is connected to a fluid supply source 354 for pressurizing and supplying a gas such as $N_2$ gas or air, or a liquid such as pure water, and has an on-off valve 344d provided anterior to the junction with the water suction line 350.

By closing the on-off valve 344d of the liquid intrusion prevention line 340b and opening the on-off valve 344c of the water suction line 350, water that has collected in the support grooves 330 and their vicinities is sucked in through the communicating holes 334a and the central hole 332 of the support rod 294b. As with the above-described support rod 294a, the removal of water may be performed either when substrates W are not supported or supported with their peripheral portions placed in the support grooves 330. The water (zincate treatment solution) that has been sucked in through the water suction line 350 is returned to the zincate treatment tank 256.

When, for example, substrates W held by the substrate holder 280b are immersed in a processing liquid (zincate solution) in the zincate treatment tank 256 for zincate treatment of the substrates W, the on-off valve 344d of the liquid intrusion prevention line 340b is opened and the on-off valve 344c of the water suction line 350 is closed so that a gas, such as $N_2$ gas or air, is passed through the central hole 332 and the communicating holes 334a of the support rod 294b, and is jetted in the support grooves 330. This can prevent the processing liquid (zincate solution) in the zincate treatment tank 256 from intruding through the communicating holes 334a into the central hole 332. In order to avoid precipitation from the processing liquid in the communicating holes 334a and the central hole 332, both having a small diameter, intrusion of the processing liquid into those holes should be prevented as much as possible.

As with the above-described support rod 294a, support grooves 330 are provided also in each support rod 294c of the substrate holder 280c of the Ni plating module 266 and in each support rod 294d of the substrate holder 280d of the Au plating module 272. The support grooves 330 of each support rod 294c or 294d communicate with a central hole 332, closed at one end and provided in the interior of the support rod, via communicating holes 334a each consisting of a plurality of holes. To the open end of the central hole 332 is connected a water removal mechanism 336b having the same construction as described above, including a water suction line 350 and a liquid intrusion prevention line 340b which is a pressurized fluid supply line.

A sequence of processing steps performed by the electroless plating apparatus of this embodiment will now be described with reference to FIGS. 17 through 23 and to the above-described FIG. 15.

Figure 17:
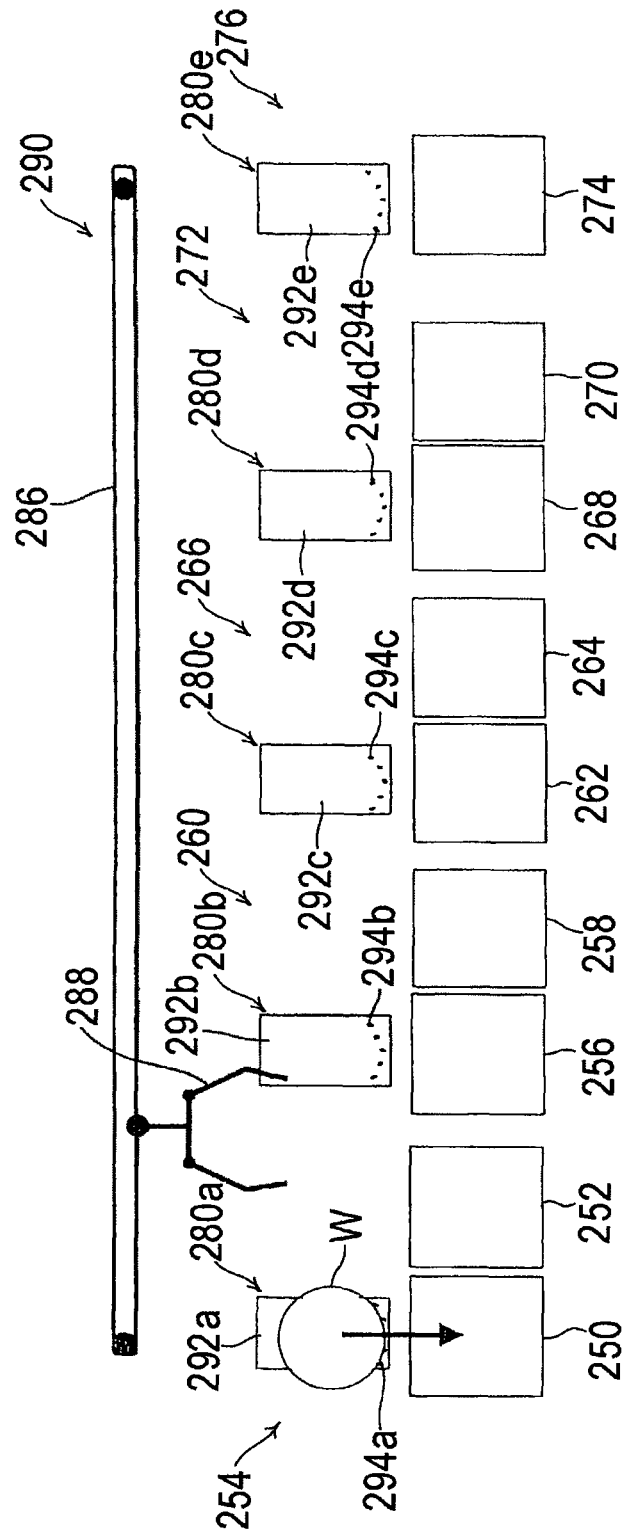
FIG. 17 is a schematic vertical sectional front view of an electroless plating apparatus according to another embodiment of the present invention, illustrating the apparatus when immersing substrates in a processing liquid (nitric acid) in a pre-cleaning tank.

First, as shown in FIG. 17, the substrate holder 280a of the pre-cleaning module 254 simultaneously receives a plurality of substrates W from the substrate holding tool 288 of the inter-module substrate transport device 290 and holds the substrates W each in a vertical position. At this moment, the substrate holder 280a lies just above the pre-cleaning tank 250. The substrates W held by the substrate holder 280a are arranged at a predetermined pitch, with a peripheral portion of each substrate W lying in a support groove 330 of each support rod 294a.

The substrate holder 280a is lowered to immerse the substrates W, held by the substrate holder 280a, in a processing liquid (nitric acid) in the pre-cleaning tank 250. The substrates W are kept immersed in the processing liquid, e.g., for one minute to remove an oxide film from the surface of each substrate W. If necessary, while immersing the substrates W in the processing liquid (nitric acid), the on-off valve 344b of the liquid circulation line 340a may be opened and the on-off valve 344a of the pressurized gas supply line 338 may be closed so that the processing liquid (nitric acid) is sucked into the communicating holes 334a of each support rod 294a, passed through the liquid circulation line 340a and returned to the pre-cleaning tank 250 in a circulatory manner. This holds for the below-described embodiment.

Figure 18:
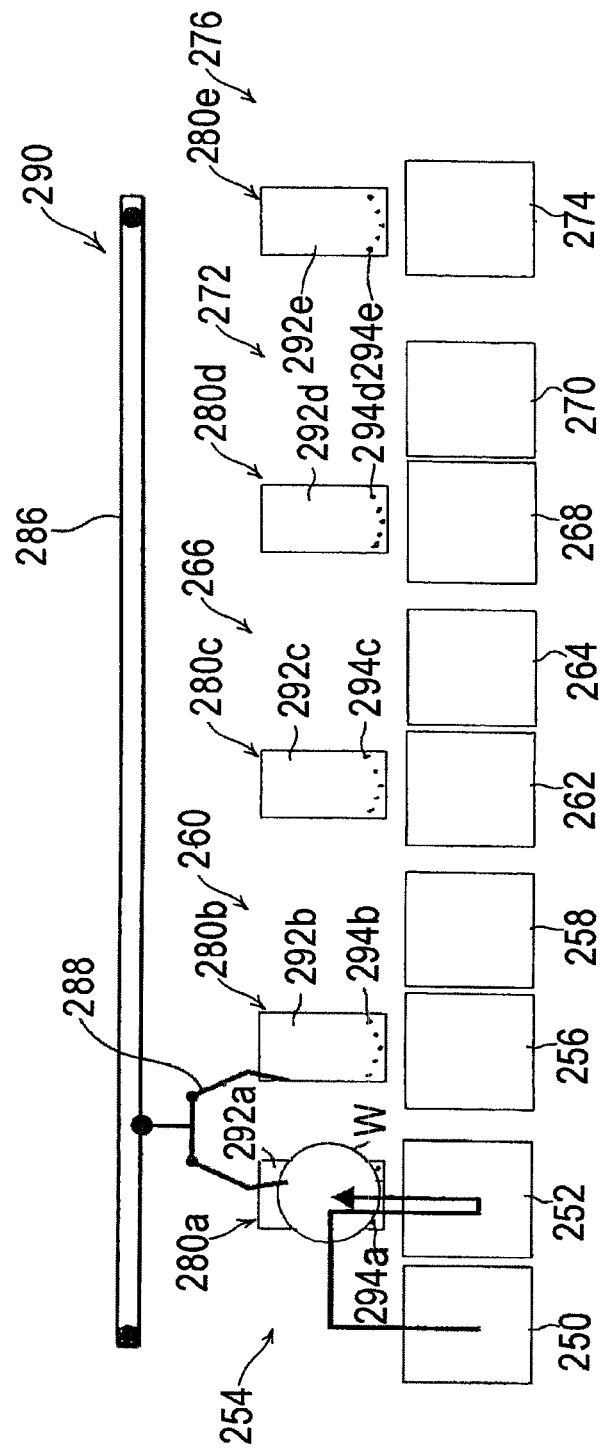
FIG. 18 is a schematic vertical sectional front view illustrating the electroless plating apparatus shown in FIG. 17 upon processing of the substrates in a pre-cleaning module.

Next, as shown in FIG. 18, the substrates W, held by the substrate holder 280a, are withdrawn from the processing liquid (nitric acid) in the pre-cleaning tank 250, and are moved to a position just above the water-cleaning tank 252. The substrate holder 280a is then lowered to immerse the substrates W, held by the substrate holder 280a, in a processing liquid (pure water) in the water-cleaning tank 252. The substrates W are kept immersed in the processing liquid (pure water), e.g., for 5 minutes to clean the surface of each substrate W with water. As described above, during the water cleaning of the substrates W, the interiors of the communicating holes 334a and the central hole 332 may be cleaned by allowing the processing liquid (pure water) in the water-cleaning tank 252 to circulate through the communicating holes 334a and the central hole 332. Thereafter, the substrates W, held by the substrate holder 280a, are withdrawn from the processing liquid (pure water) in the water-cleaning tank 252 at a controlled speed, e.g., not more than 50 mm/s. By thus controlling the substrate withdrawal speed, e.g., at a speed of not more than 50 mm/s, the processing liquid (pure water) can be prevented from remaining on the surfaces of the substrates W in a large amount.

After withdrawing the substrates W from the processing liquid (pure water), the on-off valve 344b of the liquid circulation line 340a is closed and the on-off valve 344a of the pressurized gas supply line 338 is opened so that a high-pressure gas, such as air, is introduced into the central hole 332 and the communicating holes 334a of each support rod 294a, and jetted in the support grooves 330 to blow off water that has collected in the support grooves 330 and their vicinities. Most of the water that has been blown off returns to the water-cleaning tank 252. Thus, the amount of water brought out of the water-cleaning tank 252 can be reduced. Further, water that has collected at the lower end of a substrate can also be removed to a considerable extent. This can reduce the adverse effect of mixing of water into a zincate solution on the next zincate treatment.

Figure 19:
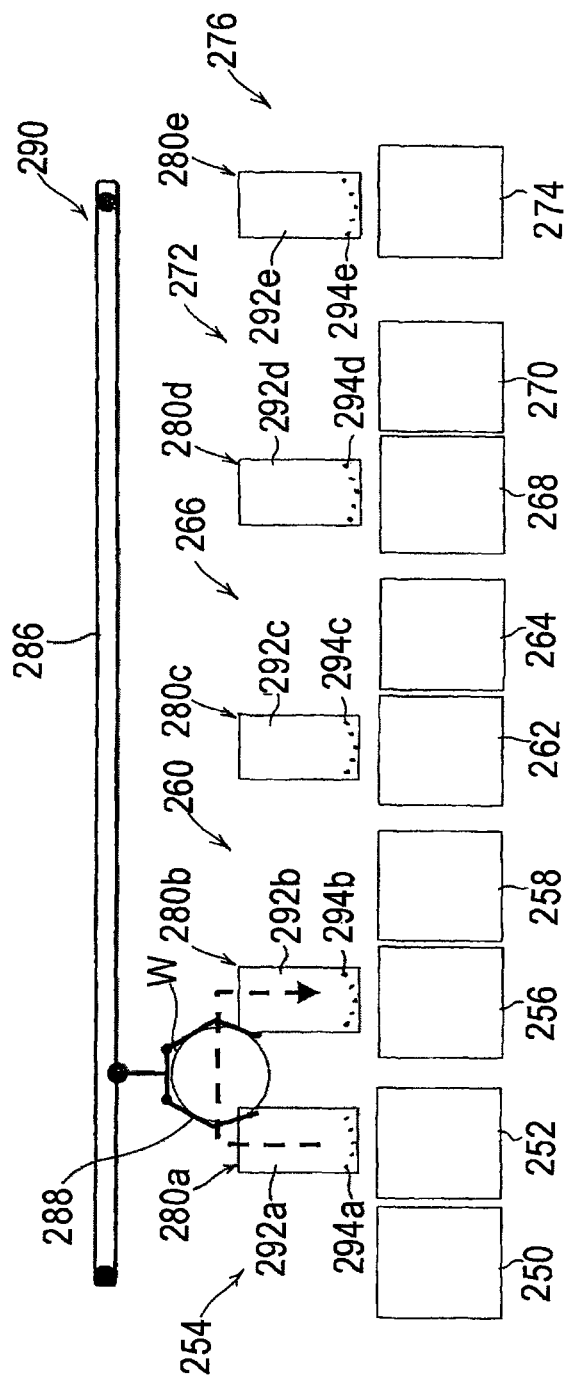
FIG. 19 is a schematic vertical sectional front view illustrating the electroless plating apparatus shown in FIG. 17 when transferring the substrates from the substrate holder of the pre-cleaning module to the substrate holder of a zincate treatment module.

Next, as shown in FIG. 19, the substrates W, held in a vertical position by the substrate holder 280a, are transferred via the substrate holding tool 288 of the inter-module substrate transport device 290 to the substrate holder 280b of the zincate treatment module 260. The substrate holder 280b lies just above the zincate treatment tank 256. Before the substrate holder 280b holds the substrates W, the on-off valve 344d of the liquid intrusion prevention line 340b is closed and the on-off valve 344c of the water suction line 350 is opened so that water that has collected in the support grooves 330 and their vicinities is sucked in through the communicating holes 334a and the central hole 332 of each support rod 294b.

Figure 20:
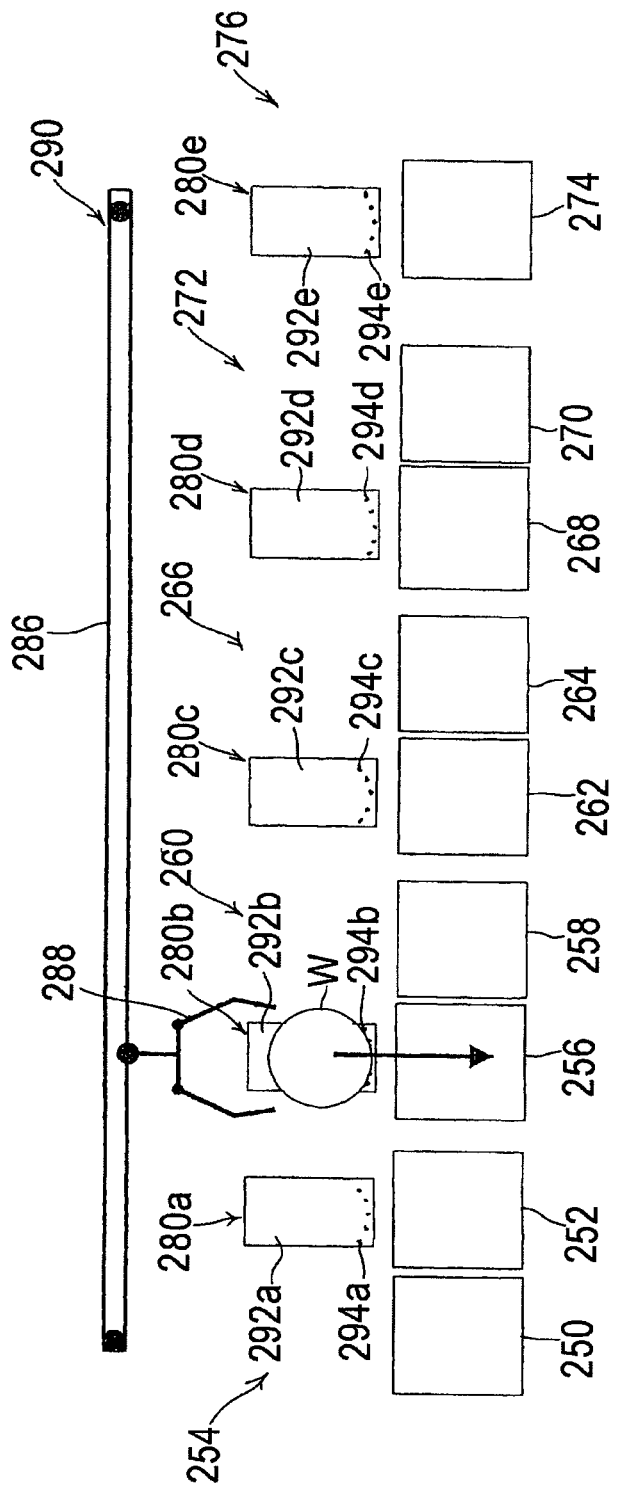
FIG. 20 is a schematic vertical sectional front view illustrating the electroless plating apparatus shown in FIG. 17 when immersing the substrates in a zincate solution in a zincate treatment tank.

Next, as shown in FIG. 20, the substrate holder 280b is lowered to immerse the substrates W, held by the substrate holder 280b, in a processing liquid (zincate solution) in the zincate treatment tank 256. The substrates W are kept immersed in the processing liquid, e.g., for 30 seconds to carry out a first zincate treatment of a surface of an Al bump pad 45 (see FIG. 7A) of each substrate W. When the substrates W held by the substrate holder 280b are immersed in the processing liquid (zincate solution), the on-off valve 344d of the liquid intrusion prevention line 340b is opened and the on-off valve 344c of the water suction line 350 is closed. This prevents the processing liquid in the zincate treatment tank 256 from intruding through the communicating holes 334a into the central hole 332 in each support rod 294b. The same holds true for the below-described embodiment.

The substrate immersion speed at which the substrates W, held by the substrate holder 280b, are immersed in the processing liquid (zincate solution) in the zincate treatment tank 256 is controlled, for example, at a speed of not less than 100 mm/s. Such a controlled substrate immersion speed, for example, of not less than 100 mm/s. can reduce the time it takes to fully immerse the substrates W, from the lower ends to the upper ends, in the processing liquid (zincate solution). When immersing the substrates W in the processing liquid (zincate solution), the substrate holder 280b is preferably vibrated or vertically or horizontally swung by the substrate movement mechanism. This can promote diffusion of the processing liquid over the surface of each substrate W.

Figure 21:
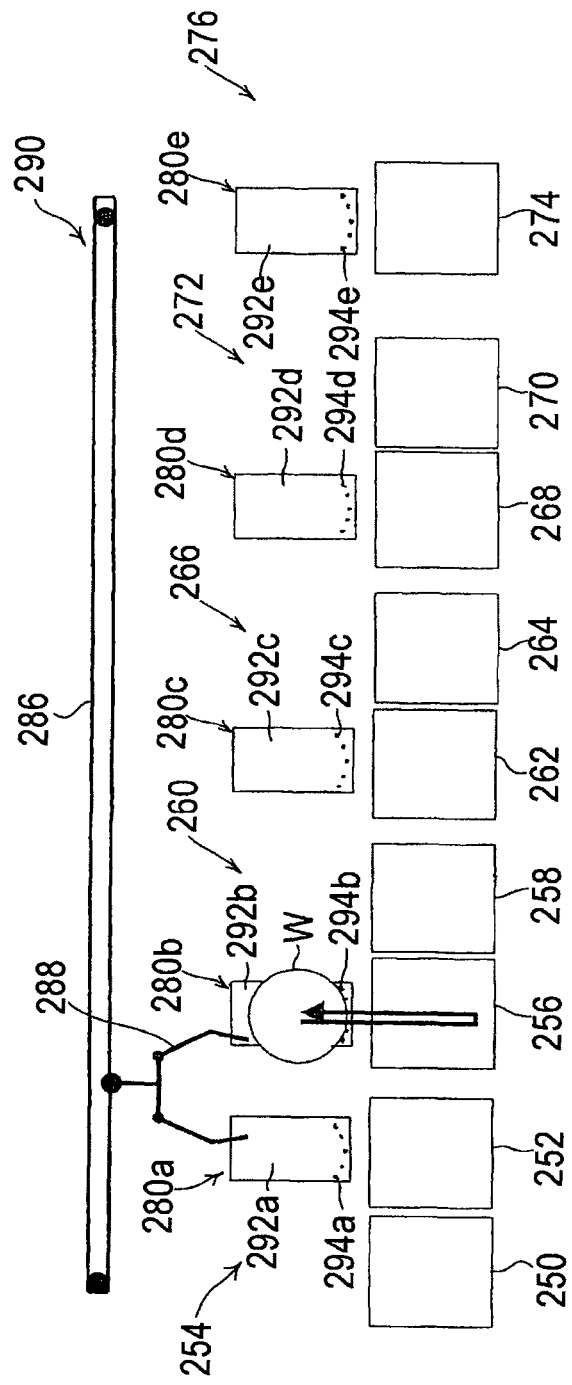
FIG. 21 is a schematic vertical sectional front view illustrating the electroless plating apparatus shown in FIG. 17 when withdrawing the substrates from the zincate solution in the zincate treatment tank after immersing the substrates in the zincate solution in the zincate treatment tank.

Next, as shown in FIG. 21, the substrates W, held by the substrate holder 280b, are withdrawn from the processing liquid (zincate solution) in the zincate treatment tank 256 at a controlled speed, e.g., not more than 50 mm/s. By controlling the substrate withdrawal speed, e.g. at a speed of not more than 50 mm/s, the processing liquid (zincate solution) can be prevented from remaining on the surfaces of the substrates W in a large amount. This in turn can prevent non-uniform processing and, in addition, can prevent an increase in the amount of the processing liquid brought out of the zincate treatment tank 256.

After withdrawing the substrates W from the processing liquid (zincate solution), the on-off valve 344d of the liquid intrusion prevention line 340b is closed and the on-off valve 344c of the water suction line 350 is opened so that water (zincate solution) that has collected in the support grooves 330 and their vicinities is sucked in through the communicating holes 334a and the central hole 332 of each support rod 294b. By thus removing water (zincate solution) by suction from the support grooves 330 and reusing it, the amount of water (zincate solution) brought out of the zincate treatment tank 256 can be minimized.

Next, the substrates W, held by the substrate holder 280b, are moved to a position just above the water-cleaning tank 258. The substrate holder 280b is then lowered to immerse the substrates W, held by the substrate holder 280b, in a processing liquid (pure water) in the water-cleaning tank 258. The substrates W are kept immersed in the processing liquid (pure water), e.g., for one minute to clean the surface of each substrate W with water. During the water cleaning of the substrates W, the interiors of the communicating holes 334a and the central hole 332 of each support rod 294b may be cleaned by passing the processing liquid (pure water) through the liquid intrusion prevention line 340b and jetting the liquid in the support grooves 330. Thereafter, the substrates W held by the substrate holder 280b are withdrawn from the processing liquid (pure water) in the water-cleaning tank 258.

The above-described cycle of processing steps: immersion of the substrates in nitric acid; the subsequent cleaning of the substrates with water; immersion of the substrates in the zincate solution; and the subsequent cleaning of the substrates with water, are repeated twice. Thus, the substrates are subjected to a double zincate treatment. Rough zinc (zinc plated film) is formed by the first zincate treatment on the surface of the Al bump pad 45 (see FIG. 7A) of the each substrate. The zinc (zinc plated film) is removed by the second processing with nitric acid, and the surface of the bump pad 45 can be densely displaced by zinc by the second zincate treatment. A zinc plated film 46, as shown in FIG. 7B, is formed in this manner.

Next, the substrates W after the double zincate treatment are transferred via the substrate holding tool 288 of the inter-module substrate transport device 290 to the substrate holder 280c of the Ni plating module 266. The substrates W, held in a vertical position by the substrate holder 80c, are immersed in a processing liquid (Ni plating solution), e.g., at 80° C. in the Ni plating tank 262, e.g., for 50 minutes to form an Ni plated film 47, as shown in FIG. 7B. The substrates W after the Ni plating are cleaned with water by immersing the substrates in a processing liquid (pure water) in the water-cleaning tank 264, e.g., for 5 minutes.

Figure 22:
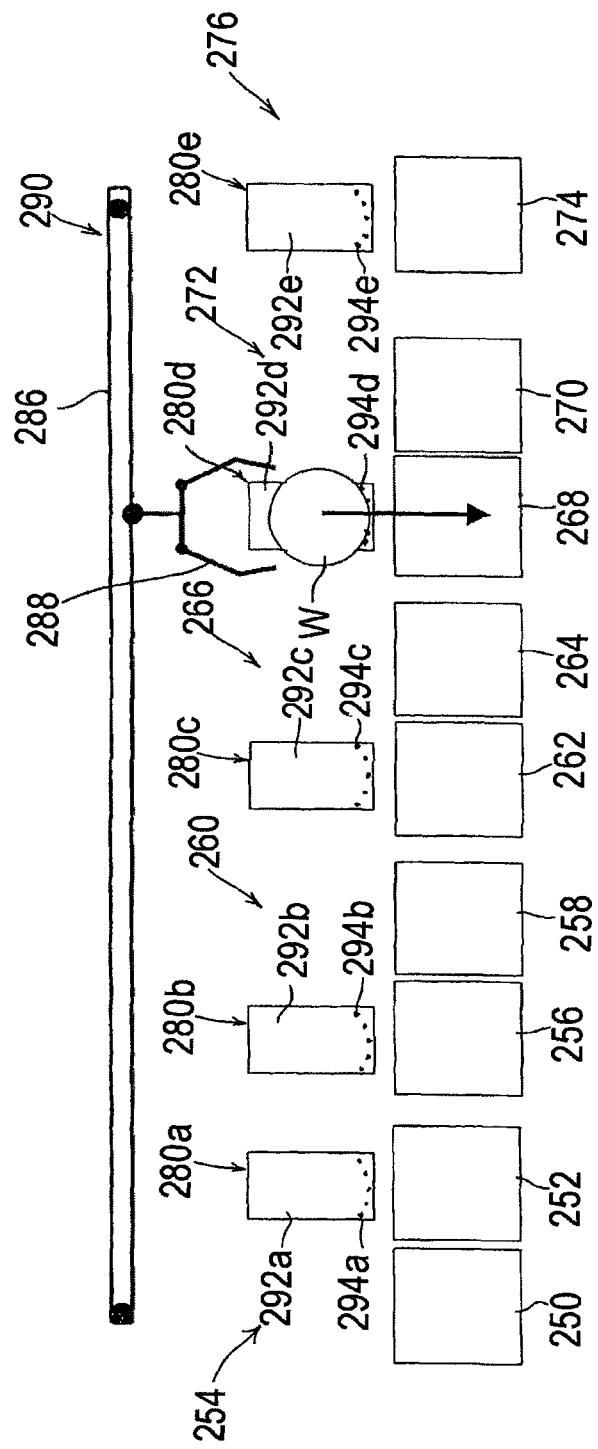
FIG. 22 is a schematic vertical sectional front view illustrating the electroless plating apparatus shown in FIG. 17 when immersing the substrates in a plating solution in an Au plating tank.

Next, the substrates W after the Ni plating are transferred via the substrate holding tool 288 of the inter-module substrate transport device 290 to the substrate holder 280d of the Au plating module 272. As shown in FIG. 22, the substrate holder 280d is lowered to immerse the substrates W, held in a vertical position by the substrate holder 280d, in a processing liquid (Au plating solution), e.g., at 75° C. in the Au plating tank 268. The substrates W are kept immersed, e.g., for 10 minutes to form an Au plated film 48, as shown in FIG. 7B.

Figure 23:
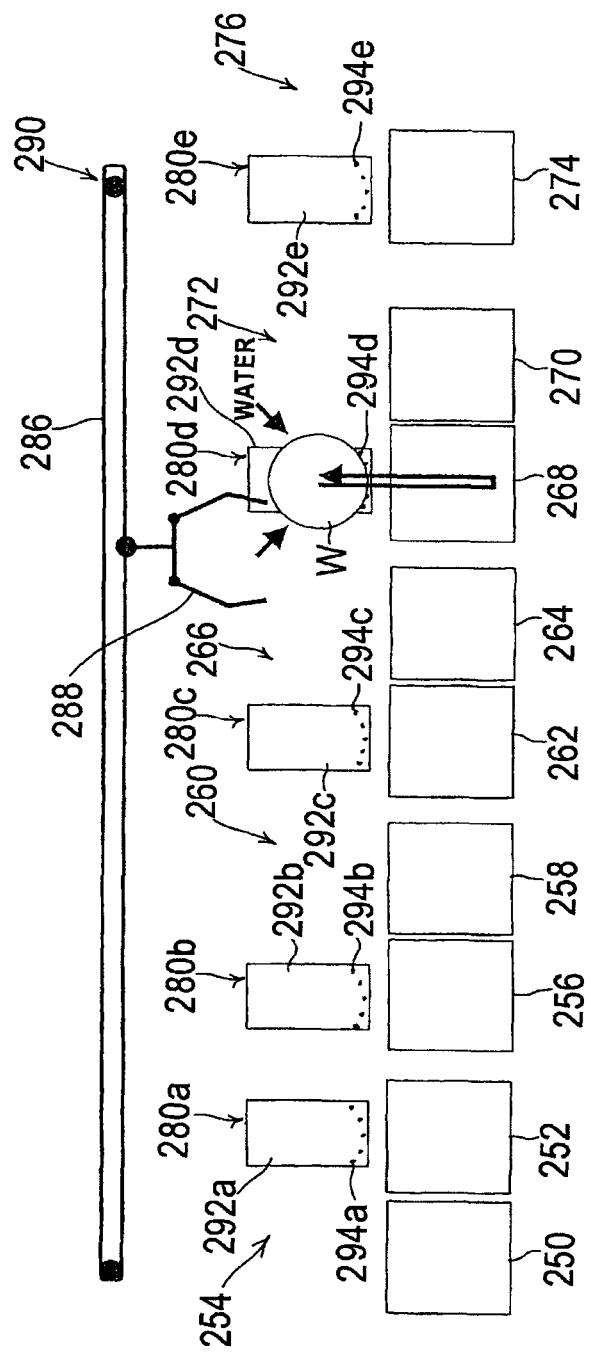
FIG. 23 is a schematic vertical sectional front view illustrating the electroless plating apparatus shown in FIG. 17 when withdrawing the substrates from the plating solution in the Au plating tank.

Next, as shown in FIG. 23, the substrates W, held by the substrate holder 280d, are withdrawn from the processing liquid (Au plating solution) in the Au plating tank 268 at a controlled speed, e.g., not more than 50 mm/s. Thereafter, water (Au plating solution) that has collected in the support grooves 330 and their vicinities is removed by suction as in the above-described manner. Thereafter, pure water is jetted from the pure water jet nozzle toward the substrates W held by the substrate holder 280d, thereby cleaning off water (Au plating solution) adhering to the substrates W and returning the Au plating solution to the Au plating tank 268. The amount of pure water jetted may be such as to replenish pure water that has been lost by processing of the substrates. The water jet cleaning can further reduce the amount of the Au plating solution, which is generally expensive, brought out of the Au plating tank 268.

A pure water jet nozzle may be provided above the Ni plating tank 262 to clean off an Ni plating solution, adhering to substrates after Ni plating, with pure water jetted from the pure water jet nozzle and return the Ni plating solution to the Ni plating tank 262.

Next, the substrates W after the Au plating are immersed in a processing liquid (pure water) in the water-cleaning tank 280, e.g., for 5 minutes to clean the substrates W with water.

Next, the substrates W after the Au plating are transferred via the substrate holding tool 288 of the inter-module substrate transport device 290 to the substrate holder 280e of the drying module 276. The substrates W, held in a vertical position by the substrate holder 280e, are dried in the drying unit 274, e.g., by air blowing or by a drying method using IPA (isopropyl alcohol) vapor.

The substrate holding tool 288 of the inter-module substrate transport device 290 receives the substrates W after drying from the substrate holder 280e, and transports the substrates W, e.g., to a substrate stage. The sequence of the electroless plating processing steps is thus completed.

Figure 30:
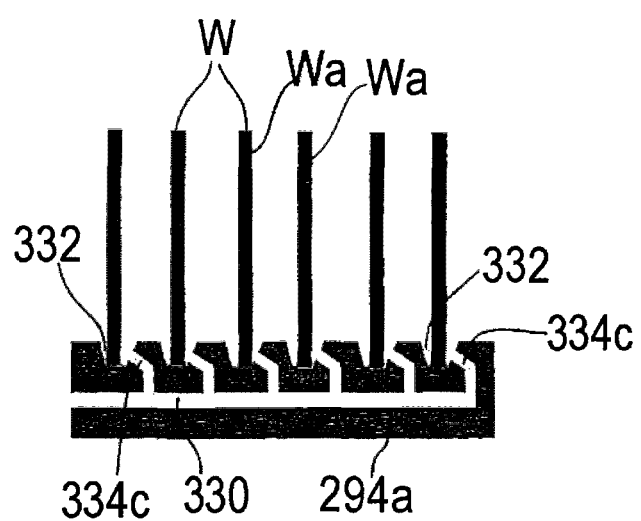
FIG. 30 is an enlarged cross-sectional view of a main portion of another example of a support rod provided in a substrate holder.

As shown in FIG. 30, when substrates W are supported by the support rods 294a of the substrate holder 280a such that the surfaces Wa to be plated of the substrates W face in the same direction, the central hole 332 of each support rod 294a may communicate with the support grooves 330 via communicating holes 334c each having an opening that faces a surface Wa to be plated of a substrate W.

Figure 31:
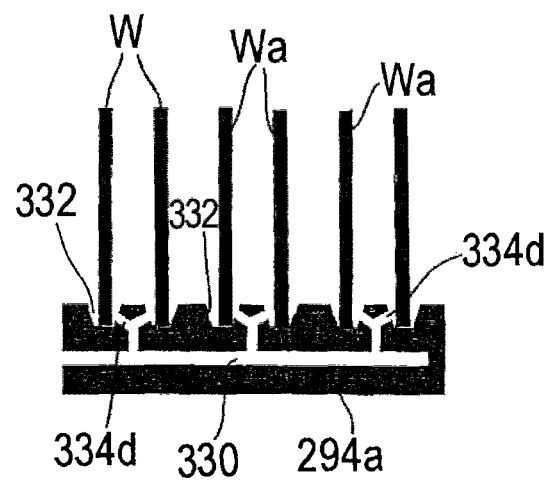
FIG. 31 is an enlarged cross-sectional view of a main portion of yet another example of a support rod provided in a substrate holder.
Figure 32:
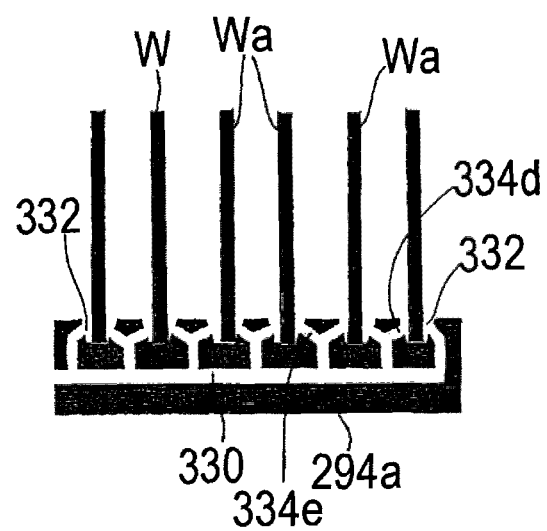
FIG. 32 is an enlarged cross-sectional view of a main portion of yet another example of a support rod provided in a substrate holder.

As shown in FIG. 31, when substrates W are supported by the support rods 294a of the substrate holder 280a such that the surfaces Wa to be plated of the substrates W face alternately in opposite directions, the central hole 332 of each support rod 294a may communicate with the support grooves 330 via communicating holes 334d each having a Y-shaped cross-section so that the hole 334d faces the opposing surfaces Wa to be plated of two adjacent substrates W. As shown in FIG. 32, it is possible to provide additional communicating holes 334e each having a Y-shaped cross-section so that the hole 334e faces the opposing back surfaces Wa of two adjacent substrates W.

This also holds for the support rods 294b-294e of the other substrate holders 280b-280e.

Figure 33A:
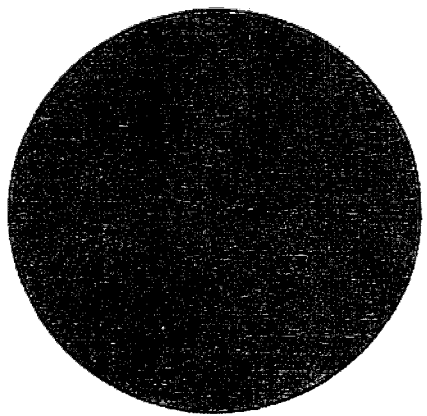
FIG. 33A is an external view of a plated wafer sample having an Ni plated film formed on an Al surface of an unpatterned wafer, and an Au plated film formed on the Ni plated film, the plated films having been formed by a sequence of electroless plating processing steps according to the present invention.

FIG. 33A is an external view of a plated wafer sample having a 6 μm Ni plated film formed on a 1 μm Al surface layer of an unpatterned wafer, and a 0.1 μm Au plated film formed on the Ni plated film, the plated films having been formed by a sequence of electroless plating processing steps performed by the electroless plating apparatus shown in FIGS. 17 through 23.

Figure 33B:
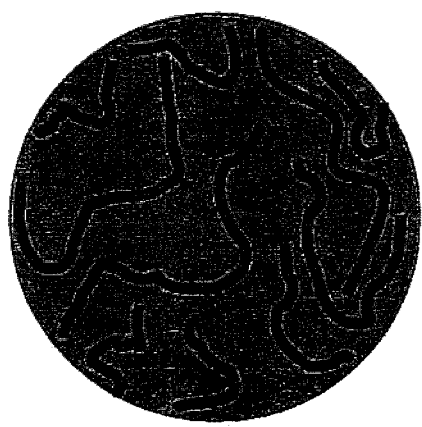
FIG. 33B is an external view of a reference wafer sample.
Figure 33C:
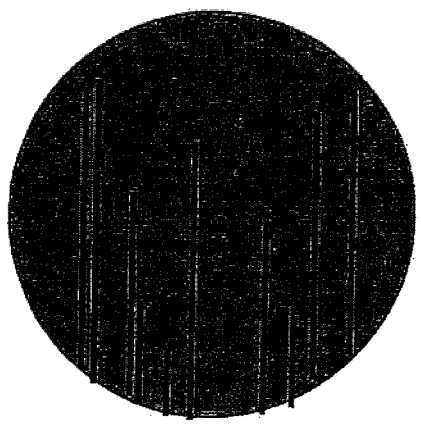
FIG. 33C is an external view of another reference wafer sample.
Figure 33D:
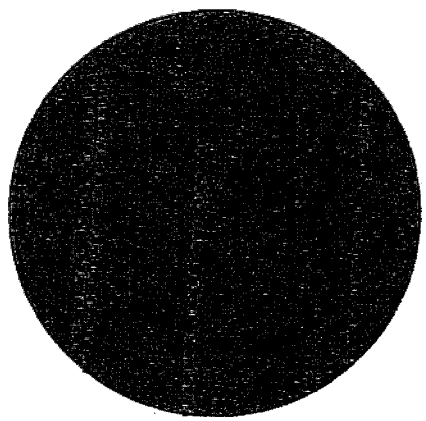
FIG. 33D is an external view of yet another reference wafer sample.

FIG. 33B is an external view of a reference wafer sample having a 6 μm Ni plated film formed on a 1 μm Al surface layer of an unpatterned wafer, and a 0.1 μm Au plated film formed on the Ni plated film, the plated films having been formed by conventional common electroless plating. FIG. 33C is an external view of a reference wafer sample having a 6 μm Ni plated film formed on a 1 μm Al surface layer of an unpatterned wafer, and a 0.1 μm Au plated film formed on the Ni plated film, the plated films having been formed by conventional common electroless plating except that after cleaning the wafer (substrate) with pure water by immersing the wafer in the pure water, the wafer is withdrawn from the pure water at a speed of not more than 50 mm/s, and subsequently the wafer is immersed in a zincate solution at an immersion speed of not less than 100 mm/s. FIG. 33D is an external view of a reference wafer sample having a 6 μm Ni plated film formed on a 1 μm Al surface layer of an unpatterned wafer, and a 0.1 μm Au plated film formed on the Ni plated film, the plated films having been formed by conventional common electroless plating except that when immersing the wafer in a zincate solution, the wafer is vibrated or swung.

As can be seen in FIGS. 33A through 33D, the streaked appearance of the reference wafer sample of FIG. 33B can be improved by withdrawing the wafer from the cleaning water at a speed of not more than 50 mm/s, and subsequently immersing the wafer in the zincate solution at an immersion speed of not less than 100 mm/s (see FIG. 33C), or by immersing the wafer in the zincate solution while vibrating or swinging the wafer (see FIG. 33D). A plated wafer having a good appearance can be obtained by additionally performing the removal of water that has collected in the support grooves and their vicinities of the support rods of the substrate holders (see FIG. 33A).

Figure 34A:
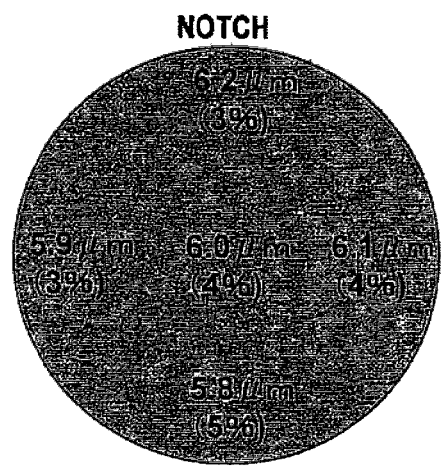
FIG. 34A shows an in-plane film thickness distribution map of a plated wafer sample having an Ni plated film formed on an Al surface of a patterned wafer, and an Au plated film formed on the Ni plated film, the plated films having been formed by a sequence of electroless plating processing steps according to the present invention.
Figure 34B:
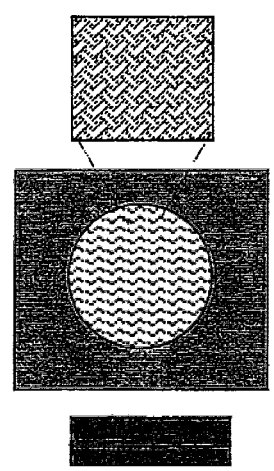
FIG. 34B shows an external view and a cross-sectional view of the wafer sample after a zincate treatment.

FIG. 34A shows an in-plane film thickness distribution map of a plated wafer sample having a 6 μm Ni plated film formed on a 1 μm Al surface layer (bump pad) of a patterned wafer, and a 0.1 μm Au plated film formed on the Ni plated film, the plated films having been formed by a sequence of electroless plating processing steps performed by the electroless plating apparatus shown in FIGS. 17 through 23. FIG. 34B shows an external view and a cross-sectional view of the wafer sample after a zincate treatment.

Figure 35A:
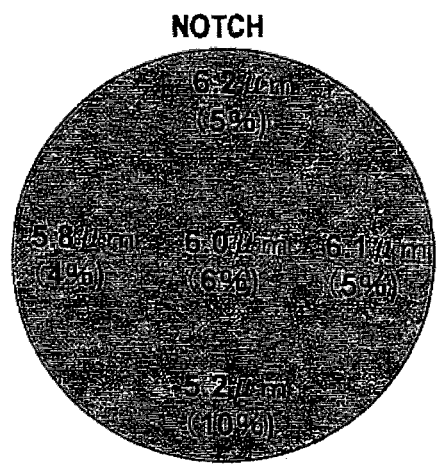
FIG. 35A shows an in-plane film thickness distribution map of a reference wafer sample having an Ni plated film formed on an Al surface of a patterned wafer, and an Au plated film formed on the Ni plated film, the plated films having been formed by conventional common electroless plating.
Figure 35B:
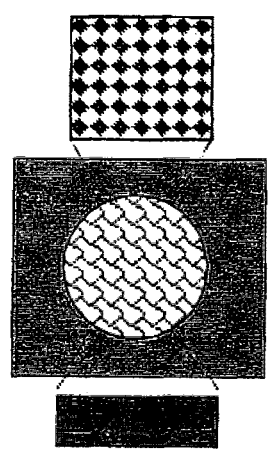
FIG. 35B shows an external view and a cross-sectional view of the wafer sample after a zincate treatment.

FIG. 35A shows an in-plane film thickness distribution map of a reference wafer sample having a 6 μm Ni plated film formed on a 1 μm Al surface layer (bump pad) of a patterned wafer, and a 0.1 μm Au plated film formed on the Ni plated film, the plated films having been formed by conventional common electroless plating. FIG. 35B shows an external view and a cross-sectional view of the reference wafer sample after a zincate treatment.

As can be seen in FIGS. 34A through 35B, the plated wafer sample of FIG. 34A, having the plated films formed according to the present invention, has a significantly reduced variation in the in-plane film thickness distribution. This is considered to be due to enhanced uniformity in the amount of zinc displaced (plated). Further, the plated wafer sample according to the present invention has a decreased roughness on the bump pad and reduced damage to the bump pad.

While the water removal mechanism 336a, including the pressurized gas supply line 338 and the liquid circulation line 340a for circulating a processing liquid through the central hole 332 of each support rod 294a, and the water removal mechanism 336b, including the water suction line 350 and the liquid intrusion prevention line 340b which is a pressurized fluid supply line, have been described, it is possible to arbitrarily combine one of a pressurized gas supply line and a water suction line and one of a liquid circulation line and a pressurized fluid supply line to make up a water removal mechanism for use in the present invention.

Figure 36:
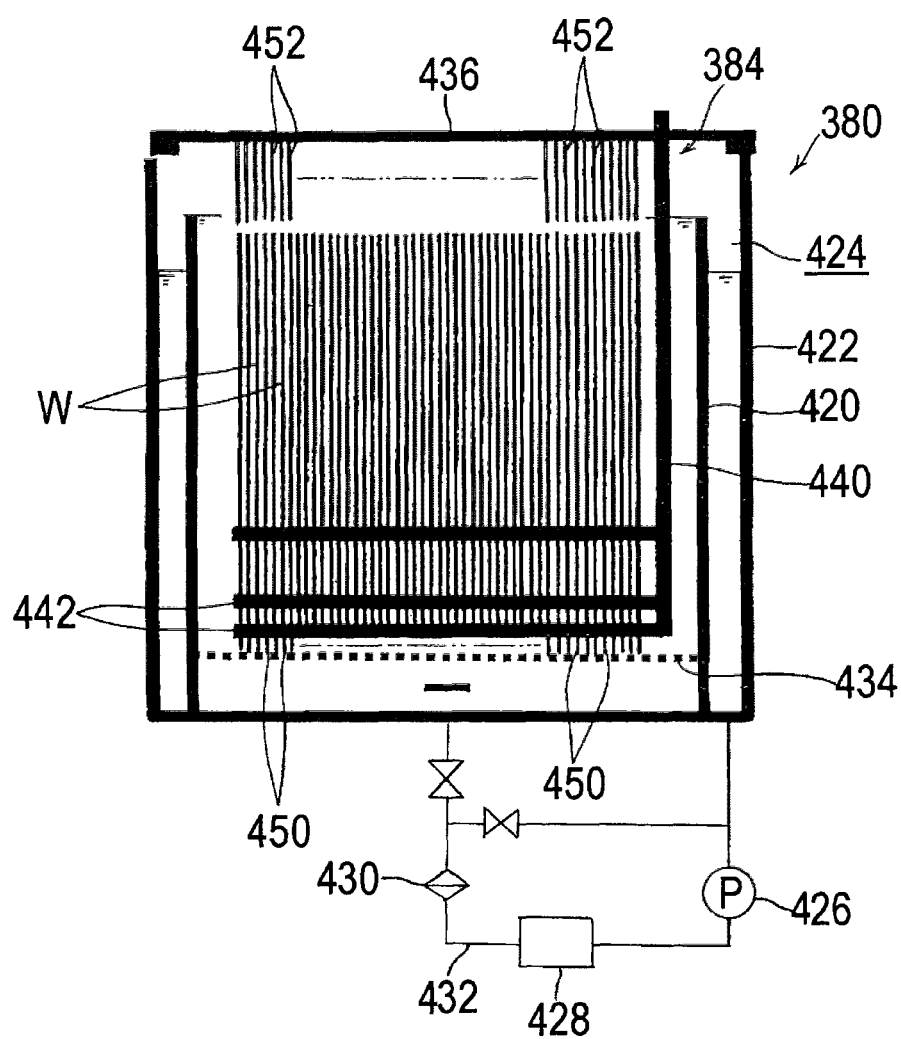
FIG. 36 is a schematic vertical sectional front view showing an Ni plating tank and a substrate holder, provided in an electroless plating apparatus according to yet another embodiment of the present invention.
Figure 37:
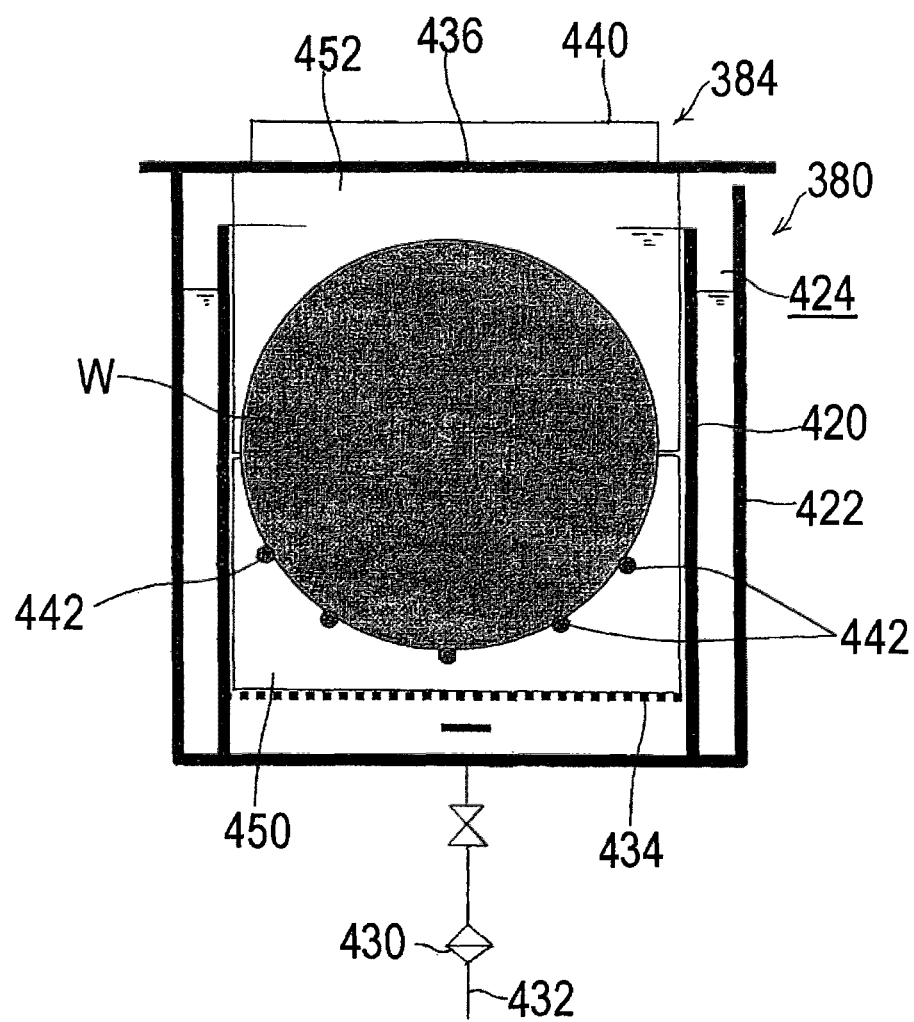
FIG. 37 is a schematic sectional side view showing the Ni plating tank and the substrate holder, provided in the electroless plating apparatus shown in FIG. 36.

FIG. 36 is a schematic vertical sectional front view showing an Ni plating tank 380 and a substrate holder 384, provided in an electroless plating apparatus according to yet another embodiment of the present invention. FIG. 37 is a schematic sectional side view showing the Ni plating tank 380 and the substrate holder 384, provided in the electroless plating apparatus shown in FIG. 36. As shown in FIGS. 36 and 37, the Ni plating tank 380 includes an inner tank 420 for holding therein an Ni plating solution as a processing liquid and an outer tank 422, with an overflow tank 424 being formed between the inner tank 420 and the outer tank 422. To the bottom of the overflow tank 424 of the Ni plating tank 380 is connected one end of a plating solution circulation line 432 having a pump 426, a temperature controller 428 and a filter 430. The other end of the plating solution circulation line 432 is connected to the bottom of the inner tank 420. A straightening plate 434 for straightening the flow of the plating solution is disposed at the bottom of the inner tank 420.

Figure 38:
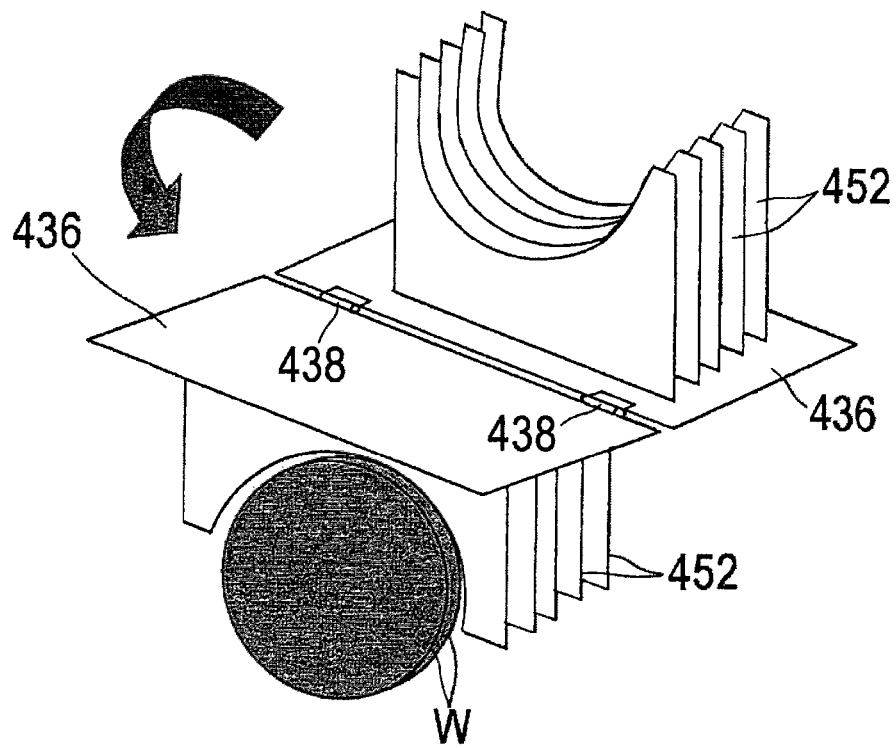
FIG. 38 is a schematic view of a lid for opening/closing the top opening of the Ni plating tank.

A lid 436 for closing the top opening of the Ni plating tank 380 to prevent evaporation of the Ni plating solution held in the tank 380 is provided openably and closably via hinges 438 (see FIG. 38) at the top of the Ni plating tank 380.

The substrate holder 384 includes a side plate 440 and a plurality of support rods 442, each extending horizontally with one end secured to the side plate 440, for supporting substrates W from below. The substrate holder 384 can hold a plurality of (e.g., 50) substrates W parallel to each other by the support rods 442.

Lower guide plates 450 are secured to the support rods 442 and are each disposed in a position which surrounds the periphery of the lower half of one of the substrates W held by the substrate holder 384. The thickness of each lower guide plate 450 is set equal to the thickness of each substrate W so that the front surface (back surface) of a substrate W, held by the substrate holder 384, becomes flush with the front surface (back surface) of the corresponding lower guide plate 450 surrounding the periphery of the lower half of the substrate W.

The distance between a substrate W, held by the substrate holder 384, and the corresponding lower guide plate 450, surrounding the periphery of the lower half of the substrate W, is set at 1 to 10 mm. This distance is desirably as small as possible, but in practice, it is preferably in the range of 1 to 10 mm in view of machining accuracy, etc.

On the other hand, as schematically shown in FIG. 36, to the back surface of the lid 436, which opens/closes the top opening of the Ni plating tank 380, are mounted upper guide plates 452 which, when the lid 436 is closed, each lie in a position surrounding the periphery of the upper half of one of the substrates W held by the substrate holder 384. As with the lower guide plates 450, the thickness of each upper guide plate 452 is set equal to the thickness of each substrate W, and the distance between a substrate W, held by the substrate holder 384, and the corresponding upper guide plate 452, surrounding the periphery of the upper half of the substrate W, is set at 1 to 10 mm.

With this structure, when substrates W, held by the substrate holder 384, are immersed in a plating solution in the Ni plating tank 380, and when the lid 436 is closed, substantially the entire periphery of each substrate W is surrounded by the lower guide plate 450 and the upper guide plate 452.

Figure 39:
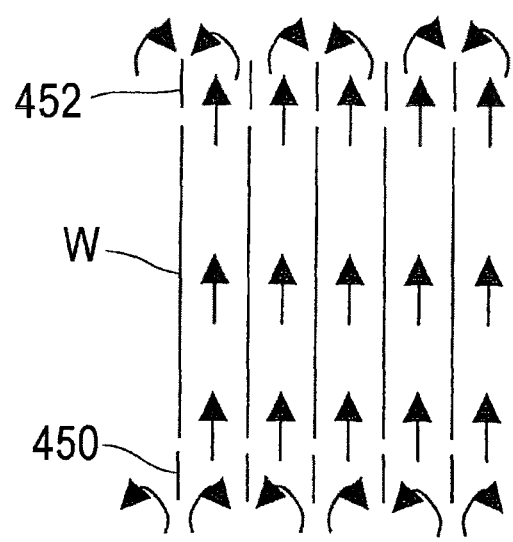
FIG. 39 is a diagram illustrating the flow of a plating solution as observed when substrates, each surrounded by an upper guide plate and a lower guide plate, are simultaneously immersed in the plating solution flowing upward.

When an upward flow of the plating solution is created in the Ni plating tank 380 while the substrates W, held by the substrate holder 384 and substantially surrounded by the lower guide plates 450 and the upper guide plates 452, are immersed in the plating solution, a flow of the plating solution, continuous with an upward flow of the plating solution flowing along a surface of each substrate W, is formed around the periphery of the substrate W, as shown in FIG. 39. A flow of the plating solution, flowing in a direction away from a lower guide plate 450, is created in the vicinity of the lowest portion of the lower guide plate 450 by collision of the plating solution with the lower guide plate 450, whereas a flow of the plating solution, flowing in a direction closer to an upper guide plate 452, is created in the vicinity of the highest portion of the upper guide plate 452. Such flows of the plating solution, however, do not affect the flow of the plating solution flowing along the periphery of each substrate W.

Thus, by forming a flow of the plating solution, which is continuous with the flow of the plating solution flowing along a surface of each substrate W, in the vicinity of the periphery of the substrate W, it becomes possible to prevent the occurrence of flow turbulence in the plating solution in the vicinity of the periphery of each substrate W. This can enhance the in-plane uniformity of the thickness and the shape of a plated film formed on each substrate W.

According to the Ni plating tank 380, substrates W, held in a vertical position by the substrate holder 384, are immersed in an Ni plating solution, e.g., at 80° C. in the Ni plating tank 380, e.g., for 50 minutes to form an Ni plated film 47, as shown in FIG. 7B.

The pump 426 is driven during the plating to create an upward flow of the plating solution in the Ni plating tank 380, as shown in FIG. 39. As described above, a flow of the plating solution, continuous with an upward flow of the plating solution flowing along a surface of each substrate W, is formed around the periphery of each substrate W which is substantially surrounded by the lower guide plate 450 and the upper guide plate 452. The Ni plated film 47, formed on the surface of each substrate W, can therefore have enhanced in-plane uniformity of the thickness and the shape.

Figure 40:
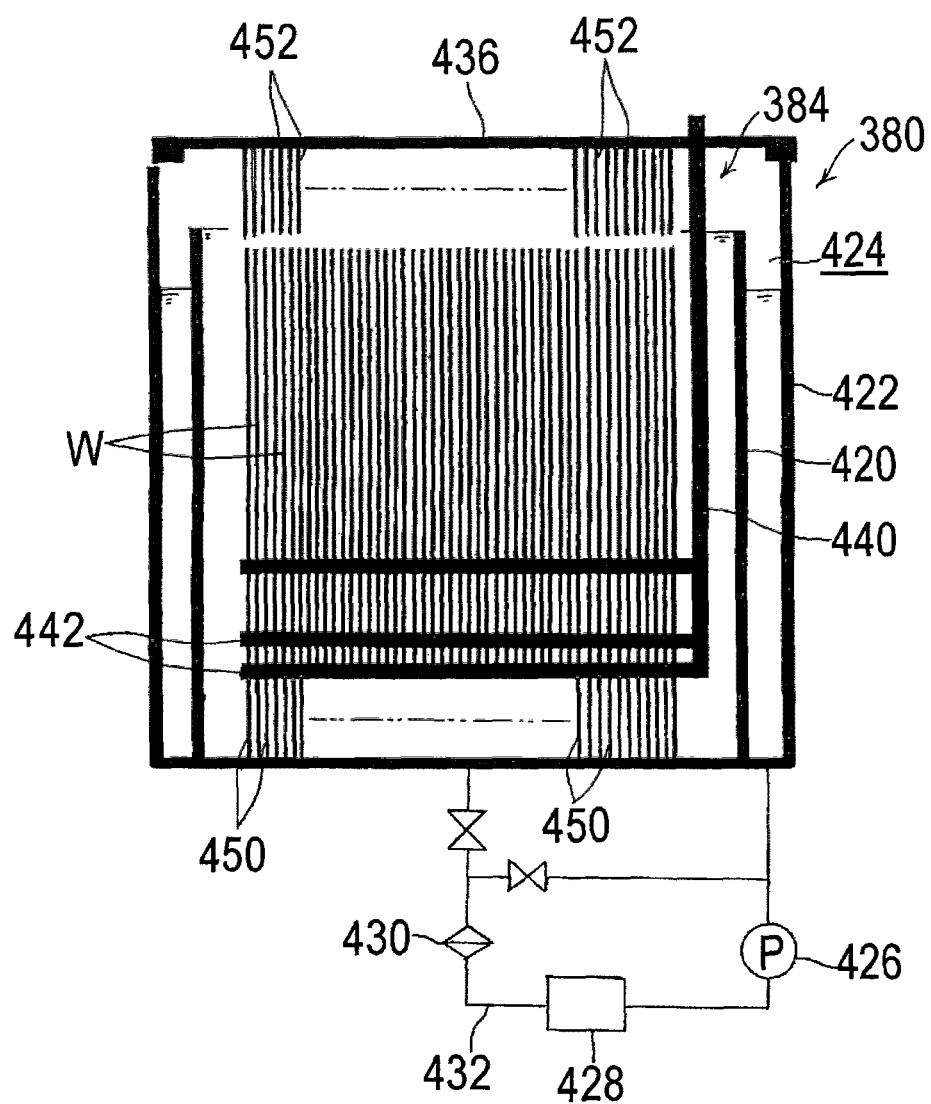
FIG. 40 is a schematic vertical sectional front view showing yet another Ni plating tank and a substrate holder.
Figure 41:
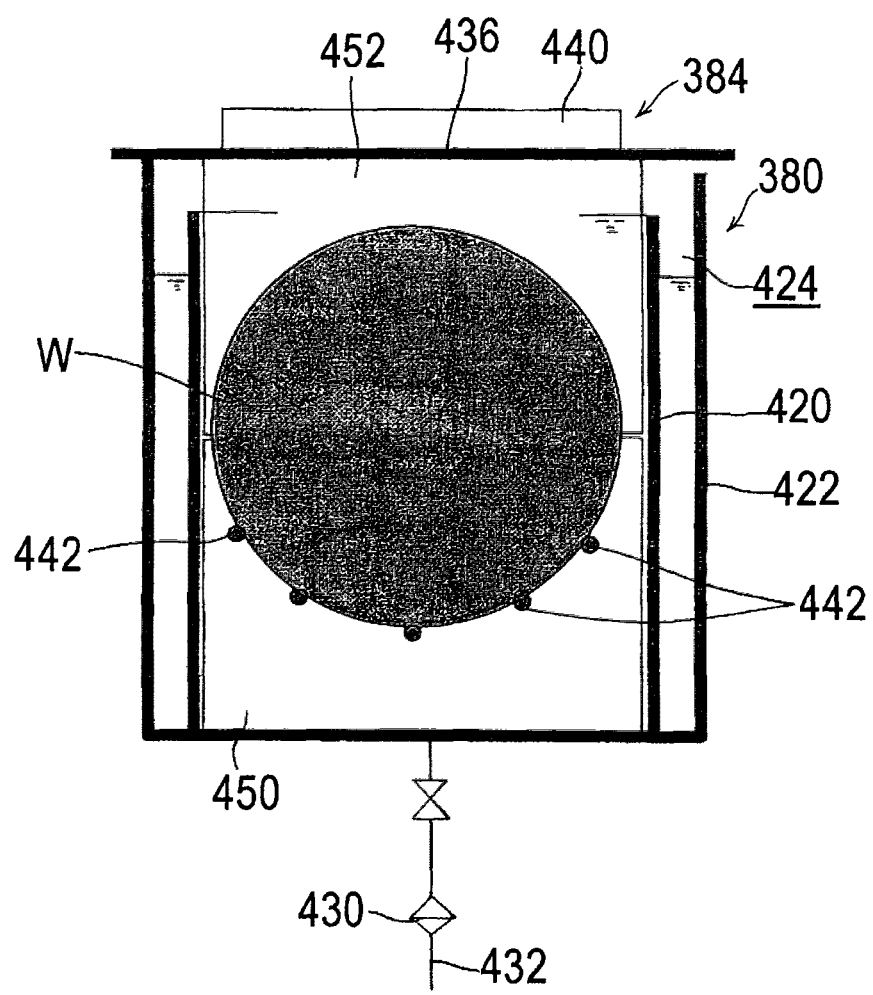
FIG. 41 is a schematic sectional side view of the Ni plating tank and the substrate holder shown in FIG. 40.

As shown in FIGS. 40 and 41, it is possible to fix the lower guide plates 450 to the lower inner surface of the inner tank 420 of the Ni plating tank 380. Thus, when substrates W held by the substrate holder 384 are immersed in a plating solution in the Ni plating tank 380, the periphery of the lower half of each substrate W is surrounded by each lower guide plates 450 secured to the inner tank 420 of the Ni plating tank 380.

Figure 42:
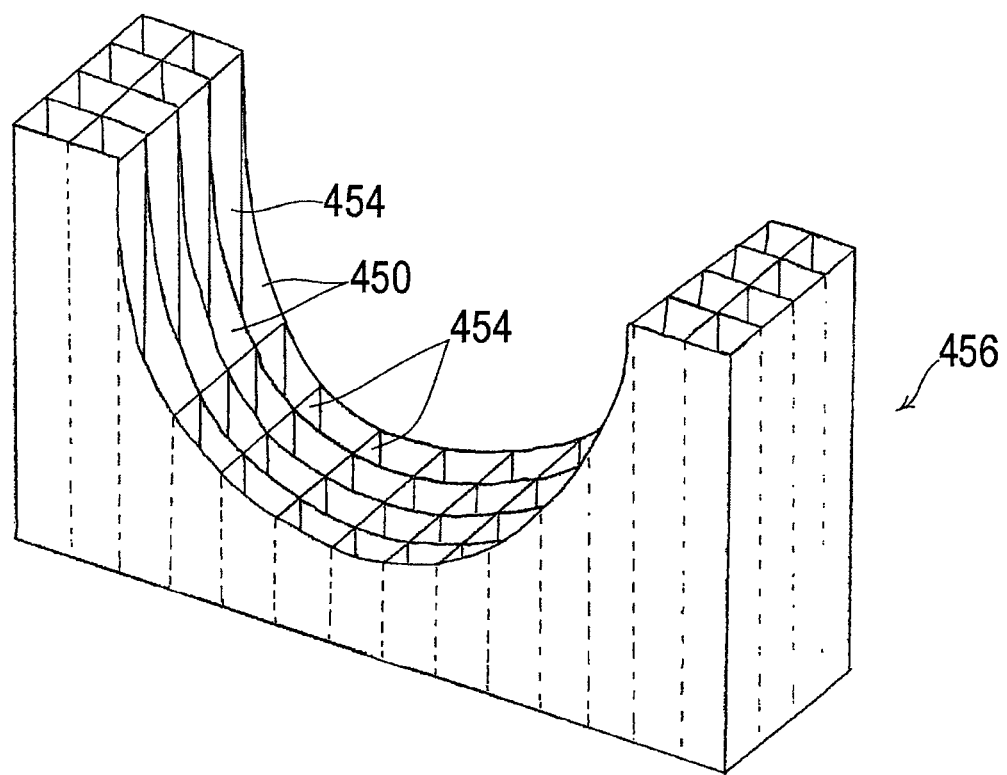
FIG. 42 is a perspective view of a grid-like lower guide plate structure comprised of lower guide plates connected by connecting plates.
Figure 43:
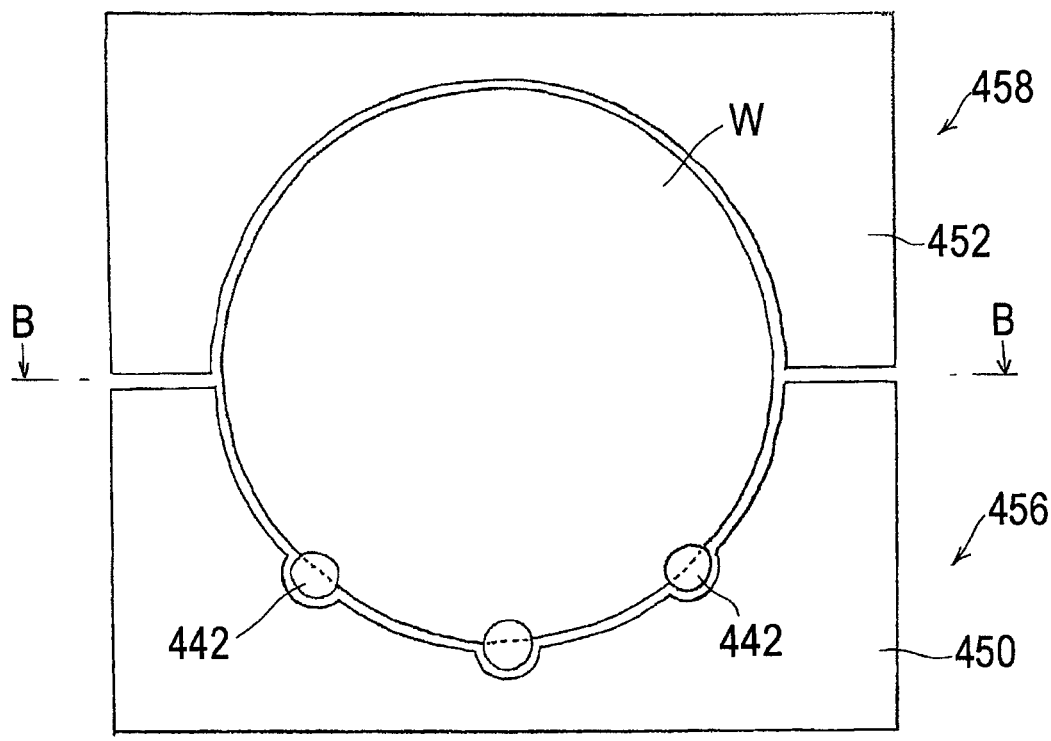
FIG. 43 is a front view showing a lower guide plate structure and an upper guide plate structure, surrounding the peripheries of substrates.

As shown in FIGS. 42 and 43, the peripheries of substrates W, held by the substrate holder 384 and immersed in a plating solution in the plating tank 380, may be surrounded by a lower grid-like guide plate structure 456, comprised of lower guide plates 450 connected by a plurality of connecting plates 454 each connecting two adjacent lower guide plates 450 and extending linearly and vertically, and an upper grid-like guide plate structure 458, comprised of upper guide plates 452 connected by a plurality of connecting plates (not shown) each connecting two adjacent upper guide plates 452 and extending linearly and vertically.

Figure 44:
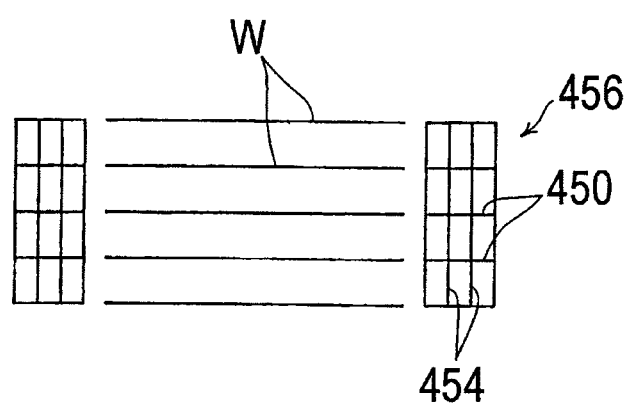
FIG. 44 is a cross-sectional view taken along line B-B of FIG. 43.

When the peripheries of substrates W, held by the substrate holder 384 and immersed in a plating solution in the plating tank 380, are surrounded by the lower grid-like guide plate structure 456 and the upper grid-like guide plate structure 458, grid-like flow passages are formed in positions lateral to and on opposite sides of the substrates W, as shown in FIG. 44. This can prevent the occurrence of flow turbulence in the plating solution flowing upwardly at the sides of the substrates W. Furthermore, the use of the lower guide plate structure 456 has the advantage that the strength and the stability of the lower guide plates 450 can be increased by reinforcing them with the connecting plates 454. The same holds true for the upper guide plate structure 458.

The same construction as described above with reference to the Ni plating tank 380 may be employed also for the Au plating apparatus 72 shown in FIG. 8 or for the Au plating apparatus 268 shown in FIGS. 17 through 23.

While the present invention has been described with reference to preferred embodiments, it is understood that the present invention is not limited to the embodiments described above, but is capable of various changes and modifications within the scope of the inventive concept as expressed herein.

What is claimed is:

1. An electroless plating apparatus comprising:
a pre-plating treatment module including a pre-plating treatment tank for carrying out a pre-plating treatment of a plurality of substrates, a water-cleaning tank for cleaning with water the substrates after the pre-plating treatment, and a substrate holder for supporting the lower sides of the substrates and transporting the substrates between the tanks;
a plating module including a plating tank for carrying out electroless plating of the substrates after the pre-plating treatment, a water-cleaning tank for cleaning with water the substrates after the electroless plating, and a substrate holder for supporting the lower sides of the substrates and transporting the substrates between the tanks; and
an inter-module substrate transport device for gripping the substrates from above and transporting the substrates between the pre-plating treatment module and the plating module,
wherein the pre-plating treatment tank is provided with a pre-plating treatment solution circulation line having a temperature control function for a pre-plating treatment solution, and
the plating tank is provided with a plating solution circulation line having a filter and a temperature control function for a plating solution, the plating solution circulation line being connected to a flushing line for flushing an interior of the plating solution circulation line and an interior of the plating tank.

2. The electroless plating apparatus according to claim 1, wherein the pre-plating treatment is a zincate treatment of an Al surface, and the pre-plating treatment tank is a zincate treatment tank.

3. The electroless plating apparatus according to claim 1, wherein the water-cleaning tank of the plating module is provided with a liquid chemical supply line for supplying a liquid chemical for removing an oxide film from a surface of a plated film.

4. The electroless plating apparatus according to claim 1, wherein at least one of the pre-plating treatment tank and the water-cleaning tank both of the pre-plating treatment module and the water-cleaning tank of the plating module has a QDR function.

5. The electroless plating apparatus according to claim 1, wherein the pre-plating treatment module and the plating module are housed in a housing having an air conditioning function for creating a downward air flow.

6. The electroless plating apparatus according to claim 1, further comprising a drying unit for drying the substrates after post-plating cleaning with water.

7. The electroless plating apparatus according to claim 1, further comprising a substrate station for temporarily placing thereon the substrates before processing.

8. The electroless plating apparatus according to claim 1, wherein the plating tank is provided with a plating solution replenishing device for measuring the metal concentration of the plating solution immediately before plating and the metal concentration of the plating solution immediately after plating, calculating the amount of metal deposited from the difference in the metal concentration between the plating solutions, comparing the amount of metal deposited with a target value and, according to the amount of metal deposited, supplying a replenisher solution having a predetermined metal concentration to the plating solution.

9. The electroless plating apparatus according to claim 8, wherein the metal concentration of the replenisher solution is corrected and, when the number of corrections exceeds a preset number of corrections, a plating solution is re-prepared.

10. The electroless plating apparatus according to claim 8, wherein the metal concentration of the plating solution after replenishing the plating solution with an amount of metal, corresponding to the amount of metal deposited during plating, and the metal concentration of the plating solution immediately before the next plating are measured and, when the latter metal concentration is lower than the former metal concentration, the filter is cleaned.

11. An electroless plating apparatus having a substrate holder for holding a plurality of substrates in a vertical position and parallel to each other, transporting the substrates and, before and after the transportation, simultaneously immersing the substrates in different processing liquids in different processing tanks, said substrate holder comprising:
support rods each having a plurality of support grooves for placing therein peripheral portions of the substrates to support the substrates; and a water removal mechanism for removing water that has collected in the support grooves and their vicinities, wherein the water removal mechanism includes a pressurized gas supply line and a liquid intrusion prevention line which are to be selectively connected to an open end of a central hole which is closed at one end and provided in an interior of each support rod, and which communicates with the support grooves via communicating holes, and the liquid intrusion prevention line is comprised of a pressurized fluid supply line for supplying a pressurized fluid into the central hole.

12. An electroless plating apparatus having a substrate holder for holding a plurality of substrates in a vertical position and parallel to each other, transporting the substrates and, before and after the transportation, simultaneously immersing the substrates in different processing liquids in different processing tanks, said substrate holder comprising:

support rods each having a plurality of support grooves for placing therein peripheral portions of the substrates to support the substrates; and a water removal mechanism for removing water that has collected in the support grooves and their vicinities, wherein the water removal mechanism includes a water suction line and a liquid intrusion prevention line which are to be selectively connected to an open end of a central hole which is closed at one end and provided in an interior of each support rod, and which communicates with the support grooves via communicating holes.

13. The electroless plating apparatus according to claim 11, further comprising a liquid circulation line for circulating a processing liquid in at least one of the processing tanks for immersing the substrates held by the substrate holder.

14. The electroless plating apparatus according to claim 11, wherein the communicating holes open onto surfaces to be plated of the substrates held by the substrate holder.

15. The electroless plating apparatus according to claim 12, wherein the liquid intrusion prevention line is comprised of a pressurized fluid supply line for supplying a pressurized fluid into the central hole.

16. The electroless plating apparatus according to claim 12, wherein the communicating holes open onto surfaces to be plated of the substrates held by the substrate holder.

17. The electroless plating apparatus according to claim 11, further comprising a control section for controlling a substrate immersion speed at which the substrates, held by the substrate holder, are immersed in a processing liquid in at least one of the processing tanks, and a substrate withdrawal speed at which the substrates are withdrawn from the processing liquid in the processing tank.

18. The electroless plating apparatus according to claim 17, wherein the substrate immersion speed is not less than 100 mm/s, and the substrate withdrawal speed is not more than 50 mm/s.

19. The electroless plating apparatus according to claim 11, further comprising a substrate movement mechanism for vibrating or vertically or horizontally swinging the substrate holder when immersing the substrates, held by the substrate holder, in a processing liquid in at least one of the processing tanks.

20. The electroless plating apparatus according to claim 11, further comprising a pure water jet mechanism for jetting pure water toward the substrates, held by the substrate holder, after immersing the substrates in a processing liquid in at least one of the processing tanks and withdrawing the substrates from the processing liquid.

* * * * *